(12) United States Patent
Fujii et al.

(10) Patent No.: US 7,342,288 B2
(45) Date of Patent: Mar. 11, 2008

(54) THIN FILM TRANSISTOR, LIQUID CRYSTAL DISPLAY APPARATUS, MANUFACTURING METHOD OF THIN FILM TRANSISTOR, AND MANUFACTURING METHOD OF LIQUID CRYSTAL DISPLAY APPARATUS

(75) Inventors: Akiyoshi Fujii, Nara (JP); Takaya Nakabayashi, Iga (JP)

(73) Assignee: Sharp Kabushiki Kaisha, Osaka (JP)

( * ) Notice: Subject to any disclaimer, the term of this patent is extended or adjusted under 35 U.S.C. 154(b) by 288 days.

(21) Appl. No.: 10/524,465

(22) PCT Filed: Jul. 23, 2003

(86) PCT No.: PCT/JP03/09361

§ 371 (c)(1),
(2), (4) Date: Feb. 15, 2005

(87) PCT Pub. No.: WO2004/023561

PCT Pub. Date: Mar. 18, 2004

(65) Prior Publication Data

US 2006/0033105 A1 Feb. 16, 2006

(30) Foreign Application Priority Data

Aug. 30, 2002 (JP) .............................. 2002-255568

(51) Int. Cl.
*H01L 29/417* (2006.01)
(52) U.S. Cl. ................................ 257/401; 257/E29.117
(58) Field of Classification Search ........ 257/E29.039, 257/E29.112, E29.116, E29.117; 438/674
See application file for complete search history.

(56) References Cited

U.S. PATENT DOCUMENTS

| 6,087,196 A | | 7/2000 | Sturm et al. |
| 6,157,048 A | * | 12/2000 | Powell ......................... 257/59 |
| 6,545,291 B1 | * | 4/2003 | Amundson et al. ........... 257/40 |

(Continued)

FOREIGN PATENT DOCUMENTS

EP 0989778 A1 3/2000

(Continued)

OTHER PUBLICATIONS

Kawase et al. "Invited Paper: All-Polymer Thin Film Transistors Fabricated by High-Resolution Ink-Jet Printing," SID 01 DIGEST Published on 2001, pp. 40-43.

*Primary Examiner*—Carl Whitehead, Jr.
*Assistant Examiner*—Jennifer M. Dolan
(74) *Attorney, Agent, or Firm*—Birch, Stewart, Kolasch & Birch, LLP

(57) ABSTRACT

A manufacturing method of a thin film transistor of the present invention includes the steps of (i) forming an electrode formation area in which a source electrode and a drain electrode are formed by applying a droplet of an electrode raw material, (ii) applying the droplet of the electrode raw material on drop-on positions located off a forming area of a semiconductor layer and in the electrode formation area, and (iii) forming the source electrode and the drain electrode in the electrode formation area. With this arrangement, it is possible to surely prevent adherence of a splash droplet on a channel section between each electrode, in forming the source electrode and the drain electrode by applying the droplet of the electrode raw material.

13 Claims, 17 Drawing Sheets

U.S. PATENT DOCUMENTS

| | | |
|---|---|---|
| 2001/0043292 A1* | 11/2001 | Tsujimura et al. ............. 349/43 |
| 2002/0006558 A1 | 1/2002 | Kobayashi et al. |
| 2002/0093474 A1* | 7/2002 | Toyoshima et al. ........... 345/87 |
| 2002/0145144 A1* | 10/2002 | Kane et al. ................... 257/72 |
| 2003/0003231 A1 | 1/2003 | Kiguchi et al. |
| 2003/0008217 A1 | 1/2003 | Kobayashi |
| 2003/0059686 A1 | 3/2003 | Kobayashi |
| 2003/0059984 A1* | 3/2003 | Sirringhaus et al. ........ 438/141 |
| 2003/0117362 A1* | 6/2003 | An ............................ 345/98 |
| 2005/0071969 A1* | 4/2005 | Sirringhaus et al. ......... 29/4.51 |

FOREIGN PATENT DOCUMENTS

| | | |
|---|---|---|
| JP | 02-275672 | 11/1990 |
| JP | 05-283695 | 10/1993 |
| JP | 11-340129 | 12/1999 |
| JP | 2000-249821 A | 9/2000 |
| WO | WO-01/20691 A1 | 3/2001 |
| WO | WO-01/47045 A1 | 6/2001 |

* cited by examiner

FIG. 6 (a) (SEMICONDUCTOR LAYER FORMATION)
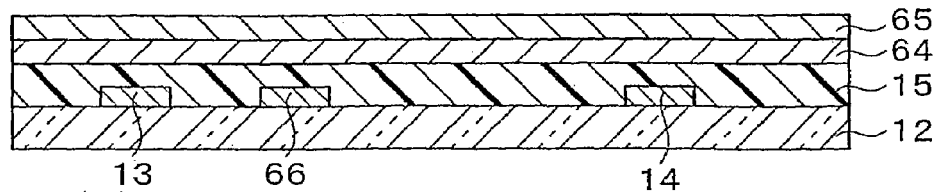
FIG. 6 (b)
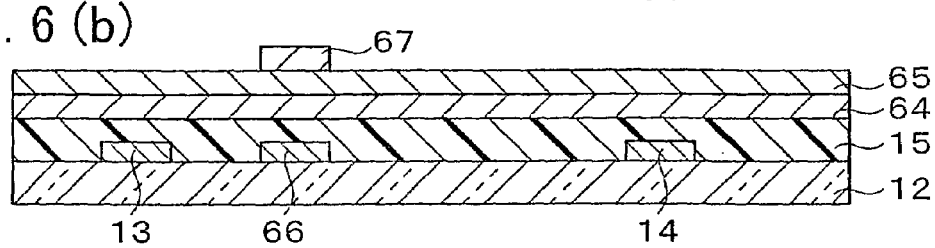
FIG. 6 (c)
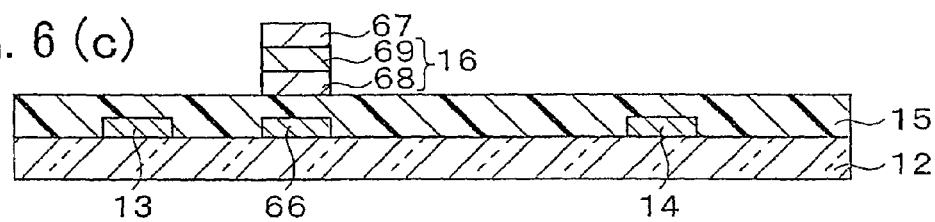
FIG. 6 (d)
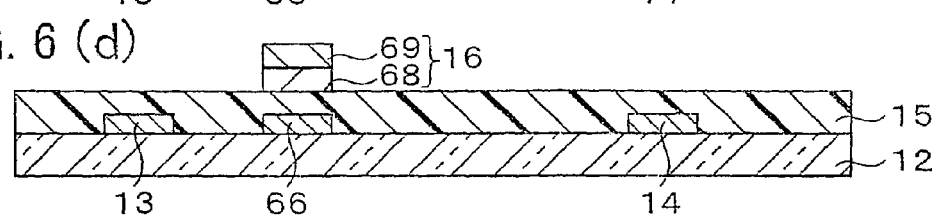
FIG. 6 (e) (CROSS SECTION TAKEN ON LINE C-C)
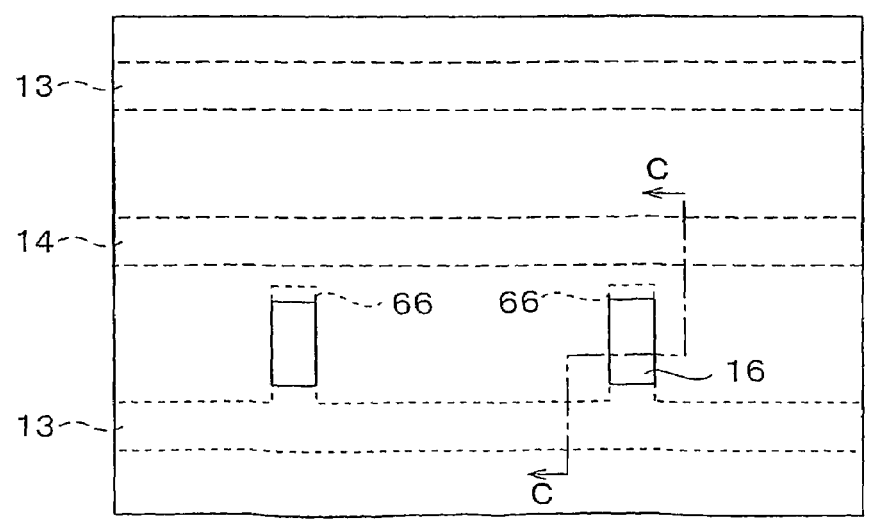

FIG. 9 (a) (SEMICONDUCTOR LAYER FORMATION)
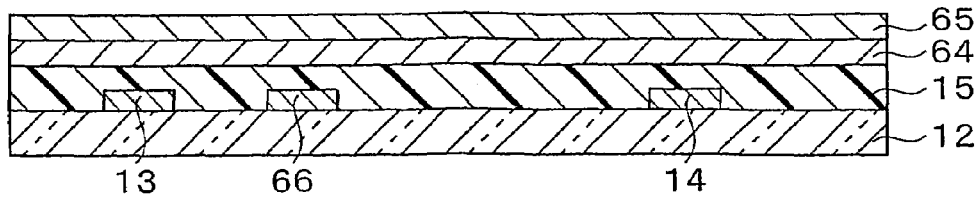
FIG. 9 (b)
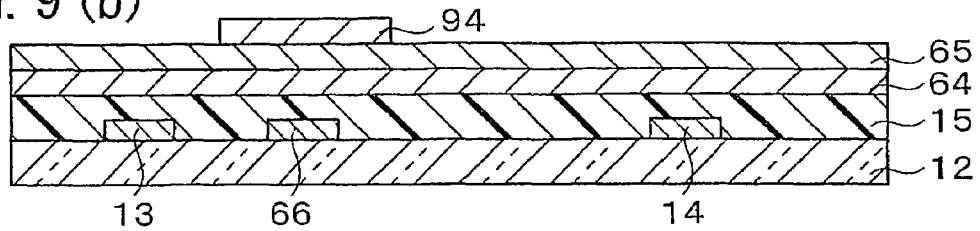
FIG. 9 (c)
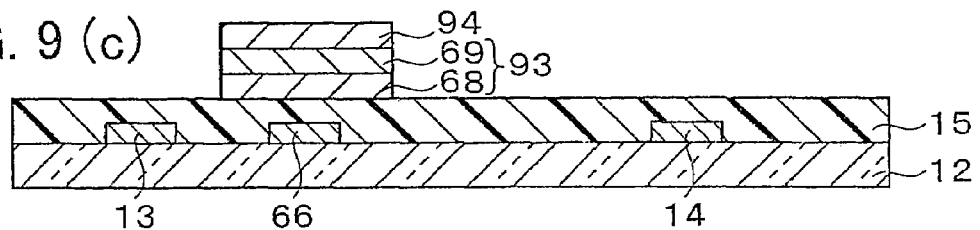
FIG. 9 (d)
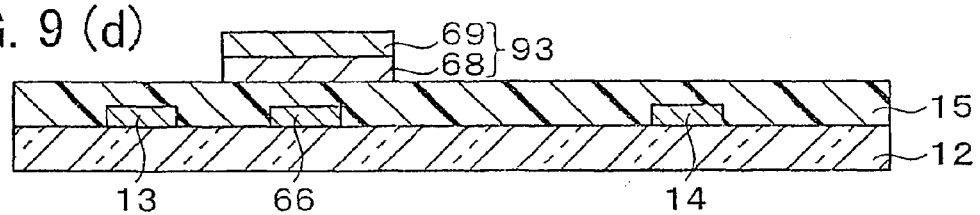
FIG. 9 (e) (CROSS SECTION TAKEN ON LINE C-C)
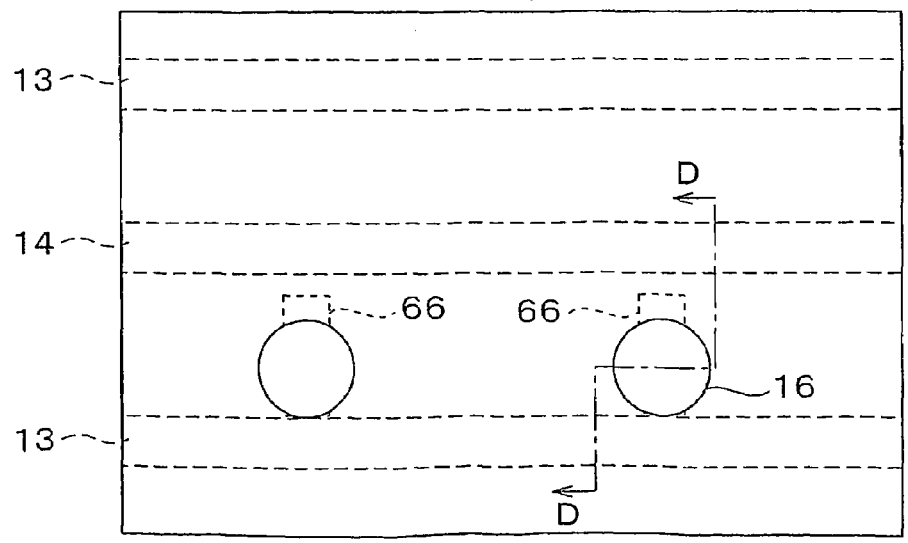

(CROSS SECTION TAKEN ON LINE E-E)

FIG. 14 (a)  E-E
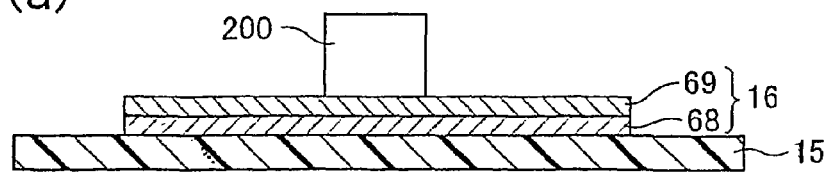
FIG. 14 (b)
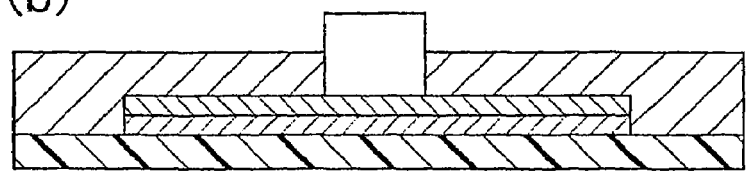
FIG. 14 (c)
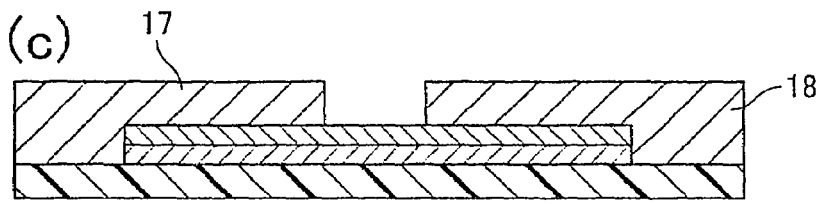
FIG. 14 (d)
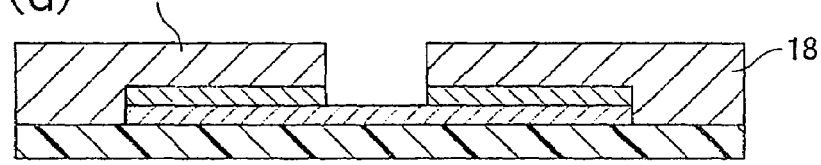
FIG. 14 (e)
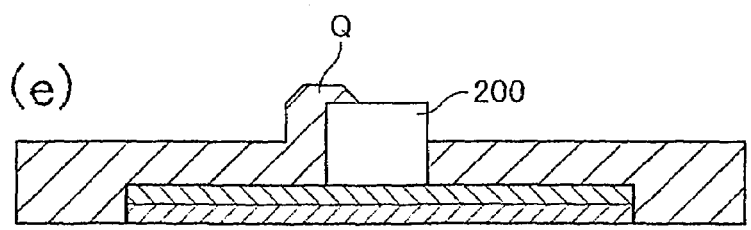
FIG. 14 (f)
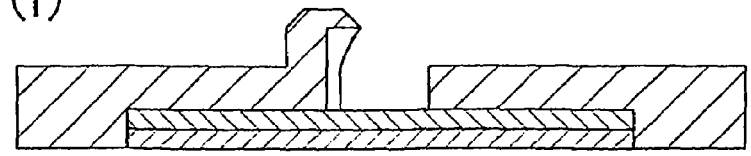
FIG. 14 (g)
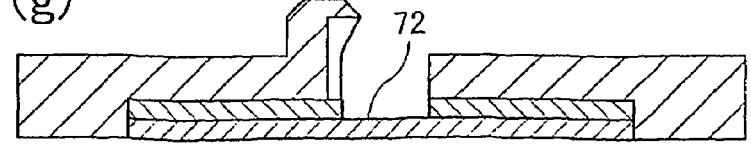

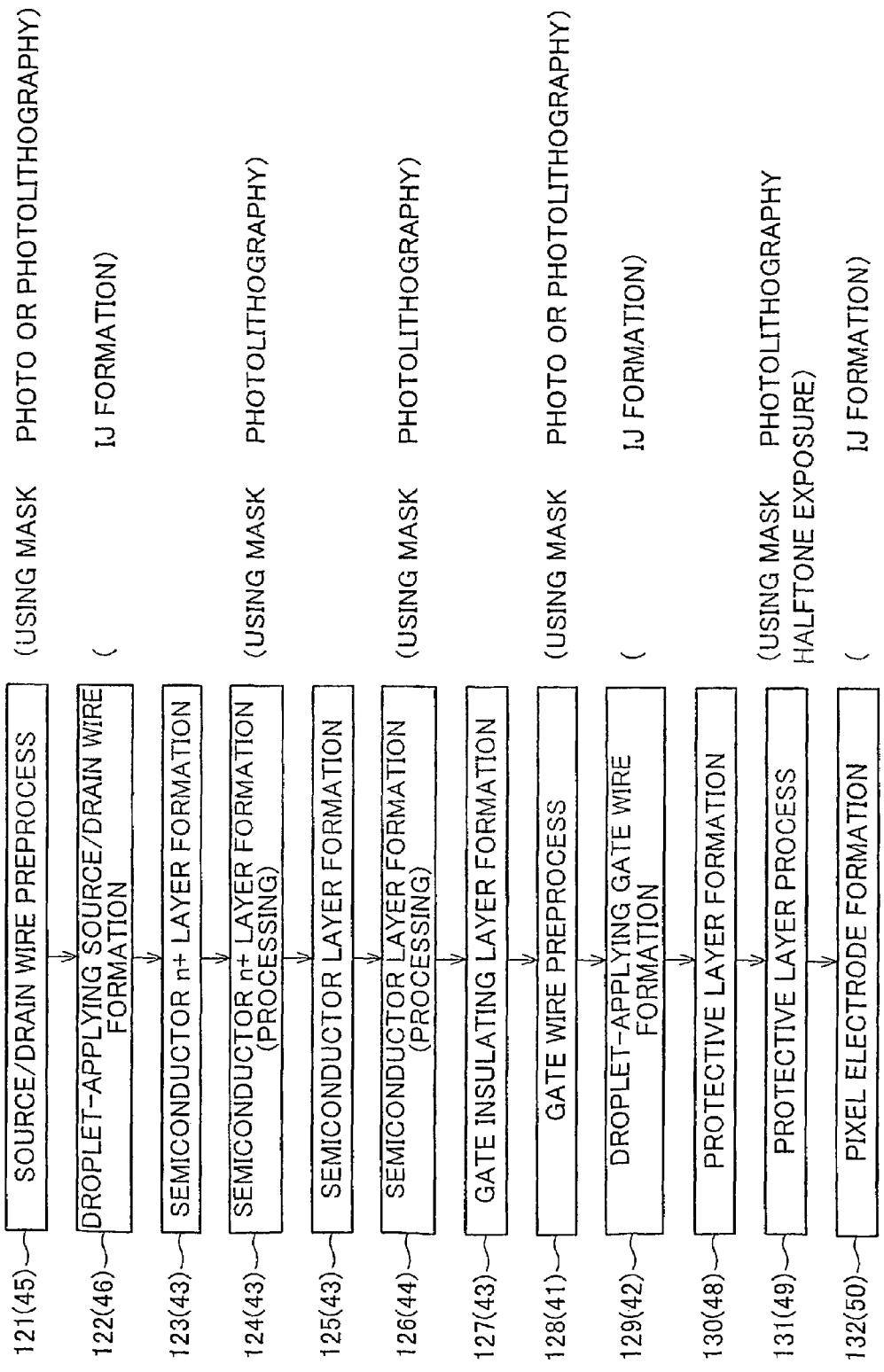

THIN FILM TRANSISTOR, LIQUID CRYSTAL DISPLAY APPARATUS, MANUFACTURING METHOD OF THIN FILM TRANSISTOR, AND MANUFACTURING METHOD OF LIQUID CRYSTAL DISPLAY APPARATUS

TECHNICAL FIELD

The present invention relates to a manufacturing method of a thin film transistor, and to a manufacturing method of a liquid crystal display apparatus.

BACKGROUND ART

Recently suggested is an art of forming wires by an ink jet method, not by using photolithography. In this art, for example, as disclosed in Japanese Publication of Unexamined Patent Application, Tokukaihei, No. 11-204529 (published Jul. 30, 1999), a substrate has an affinity area having affinity for a raw material of wires, and a non-affinity area having no affinity for the raw material of the wires, and the wires are formed by applying (adhering) droplets of the raw material of the wires onto the affinity area on the substrate by the ink jet method (hereinafter, the term "applying" includes meaning of "dropping" and "jetting").

Note that Japanese Publication of Unexamined Patent Application, Tokukaihei, No. 11-204529 corresponds to U.S. Patent Publication No. 2003/0003231 A1.

Moreover, Japanese Publication of Unexamined Patent Application, Tokukai, No. 2000-353594 (published on Dec. 19, 2000) discloses an art of similarly forming wires by the ink jet method, in which banks are formed on both sides of a wire formation area so as to prevent a raw material of the wire from overflowing out of the wire formation area, upper parts of the banks having non-affinity for liquid (dewetting property), and the wire formation area having wetting property.

Note that Japanese Publication of Unexamined Patent Application, Tokukai, No. 2000-353594 corresponds to European Patent Application, No. EP 0989778 A1.

Moreover, disclosed in SID 01 Digest, pages 40 to 43, 6.1: Invited Paper: "All-Polymer Thin Film Transistors Fabricated by High-Resolution Ink-jet Printing" (written by Takeo KAWASE, et al.) is an art in which a TFT is formed by using only an organic raw material by using an ink jet method.

In this art, after a strip made of polyimide is formed in a channel section of the TFT by photolithography, a raw material of electrodes (electrode raw material) made of a conductive polymer is printed on both sides of the channel section by using an ink jet printer. Because the strip made of polyimide has dewetting property, source and drain electrodes are formed respectively on the both sides of channel section, with no electrode raw material covering the strip.

The following explains a problem to be solved in the present invention.

When the arts of forming wires and the like by the ink jet method are adopted in manufacturing of a thin film transistor, a number of masks to need is reduced, and thus a number of steps in manufacturing process is reduced, compared with a case where the photolithography is used. Moreover, because a large-scale processing apparatus for forming the wire and the like is no longer necessary, cost of equipment is lowered. Those lead to cost-down.

Therefore, it is advantageous to adopt, in manufacturing of the thin film transistor, the art of forming the wire and the like by the ink jet method, because of the benefits given by the use of the art.

However, in case where simply the ink jet method is used to form the source or drain electrode of the thin film transistor by dropping (applying) droplets of the raw material of the electrodes in an area in which the source or drain electrode is to be formed, there is a possibility that a droplet (splash droplet) splashed in jetting may adhere on the channel section in the thin film transistor and remain thereon.

In this case, leakage may occur between the source and drain electrodes due to the slash droplet adhered on the channel section, or the splash droplet may work as a mask in processing an n+ layer so that the n+ layer is remained so as to allow a leak current to flow between the source and drain electrodes, thereby failing to obtain desired TFT characteristics.

DISCLOSURE OF INVENTION

The present invention, which is to solve the forgoing problems, has a main object to provide a thin film transistor having an electrode arrangement in which a splash droplet of an electrode raw material will not be adhered on a channel section of the thin film transistor, and a manufacturing method of the same.

In order to solve the forgoing object, a thin film transistor of the present invention is provided with (i) a semiconductor layer, which faces a gate electrode via a gate insulation layer, (ii) a source electrode and a drain electrode, which are electrically connected with the semiconductor layer, and (iii) a channel section between the source electrode and the drain electrode, wherein the source electrode and the drain electrode are formed by applying a droplet of an electrode raw material, and have a branch section at branching-off parts thereof located off a forming area of the semiconductor layer, the branch section including a plurality of branch electrodes, at least part of which are in a forming area of the semiconductor layer, the branch electrodes of the source electrode and the branch electrodes of the drain electrode being alternately arrayed.

With the above arrangement, in which the branching-off parts of the branch electrode section of the source electrode and the drain electrode are located off the forming area of the semiconductor layer (an area in which the semiconductor layer is located), it is possible to have the drop-on positions at the branching-off parts located off the forming area of the semiconductor layer, in case the source electrode and the drain electrode having the branch electrode section are formed.

With this arrangement, in forming the source electrode and the drain electrode, it is possible to prevent the adherence of the splash droplet on the channel section between the electrodes. Therefore, it is possible to avoid failure in obtaining desired TFT characteristics by a leak current between the source and drain electrodes due to remained n+ layer that is remained because the splash droplet works as a mask.

Moreover, the wide channel section is formed between each of the branch electrodes that are alternately arrayed. Thus, this arrangement is effective for a case where a charge transfer is large such as a case where a large number of pixels are to be driven.

A liquid crystal display apparatus of the present invention is so arranged as to include the thin film transistor of the present invention.

A manufacturing method of a thin film transistor of the present invention, the thin film transistor including (i) a semiconductor layer on a gate electrode, (ii) a gate insulation layer between the semiconductor layer and the gate electrode, (iii) a source electrode and a drain electrode on the semiconductor layer, and (iv) a channel section between the source electrode and the drain electrode, the manufacturing method includes the steps of: preprocessing so as to form an electrode formation area in which the source electrode and the drain electrode are formed, after a step of forming the semiconductor layer; and applying a droplet of an electrode raw material on a drop-on position located in the electrode formation area, so as to form the source electrode and the drain electrode respectively in the electrode formation area, the drop-on positions being off a forming area of the semiconductor layer.

With the above arrangement, in which the source electrode and the drain electrode are formed by applying a droplet on the drop-on positions which are located in the electrode formation area and located off the forming area of the semiconductor layer, it is possible to prevent the adherence of the splash droplet on the channel section between the electrodes. Therefore, it is possible to avoid failure in obtaining desired TFT characteristics by a leak current between the source and drain electrodes due to remained n+ layer that is remained because the splash droplet works as a mask.

A manufacturing method of a liquid crystal display apparatus of the present invention includes the manufacturing method of the thin film transistor of the present invention.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) is a plan view schematically illustrating an arrangement of one pixel in the TFT array substrate in a liquid crystal display apparatus of the embodiment of the present invention, while FIG. 2(b) is a cross sectional view taken on line A-A of FIG. 2(a).

FIGS. 6(a) to 6(c) are cross sectional views of part corresponding to a cross section taken on line B-B of FIG. 5(b). FIG. 6(a) illustrates a gate insulating layer formation/semiconductor layer formation step shown in FIG. 4. FIG. 6(b) illustrates a state after a photolithography step is completed after a step of forming a gate insulation layer and a semiconductor layer in the semiconductor layer formation step shown in FIG. 4. FIG. 6(c) illustrates a step of etching an a-Si film formation layer and an n+ film formation layer in the semiconductor layer formation step. FIG. 6(d) is a cross sectional view taken on line C-C of FIG. 6(e), the FIG. 6(d) illustrating a step of removing a resist in the semiconductor layer formation step. FIG. 6(e) is a plan view of the TFT array substrate that has been subjected to the semiconductor layer formation step.

FIGS. 9(a) to 9(c) are cross sectional views of part corresponding to a cross section taken on line B-B of FIG. 5(b). FIG. 9(a) illustrates a gate insulation layer formation/semiconductor layer formation step, shown in FIG. 4, for a case where the TFT array substrate having the TFT section shown in FIG. 8. FIG. 9(b) illustrates a state after a photolithography step is completed after a step of forming a gate insulation layer and a semiconductor layer in the semiconductor layer formation step shown in FIG. 4. FIG. 9(c) illustrates a step of etching an a-Si layer and an n+ layer in the semiconductor layer formation step. FIG. 9(d) is a cross sectional view taken on line D-D of FIG. 9(e), the FIG. 9(d) illustrating a step of removing a resist in the semiconductor layer formation step. FIG. 9(e) is a plan view of the TFT array substrate that has been subjected to the semiconductor layer formation step.

FIGS. 14(a) to 14(d) are schematic cross sectional views illustrating steps in production process of the channel section of the TFT section. FIGS. 14(e) to 14(g) are schematic cross sectional views, taken on line E-E' of FIG. 13, illustrating steps in production process of the channel section for a case where the splash droplet of the electrode raw material remains on the channel section.

FIG. 18 is a flow chart showing a manufacturing step of a TFT array substrate having a top gate structure.

BEST MODE FOR CARRYING OUT THE INVENTION

First Embodiment

Figure 1:
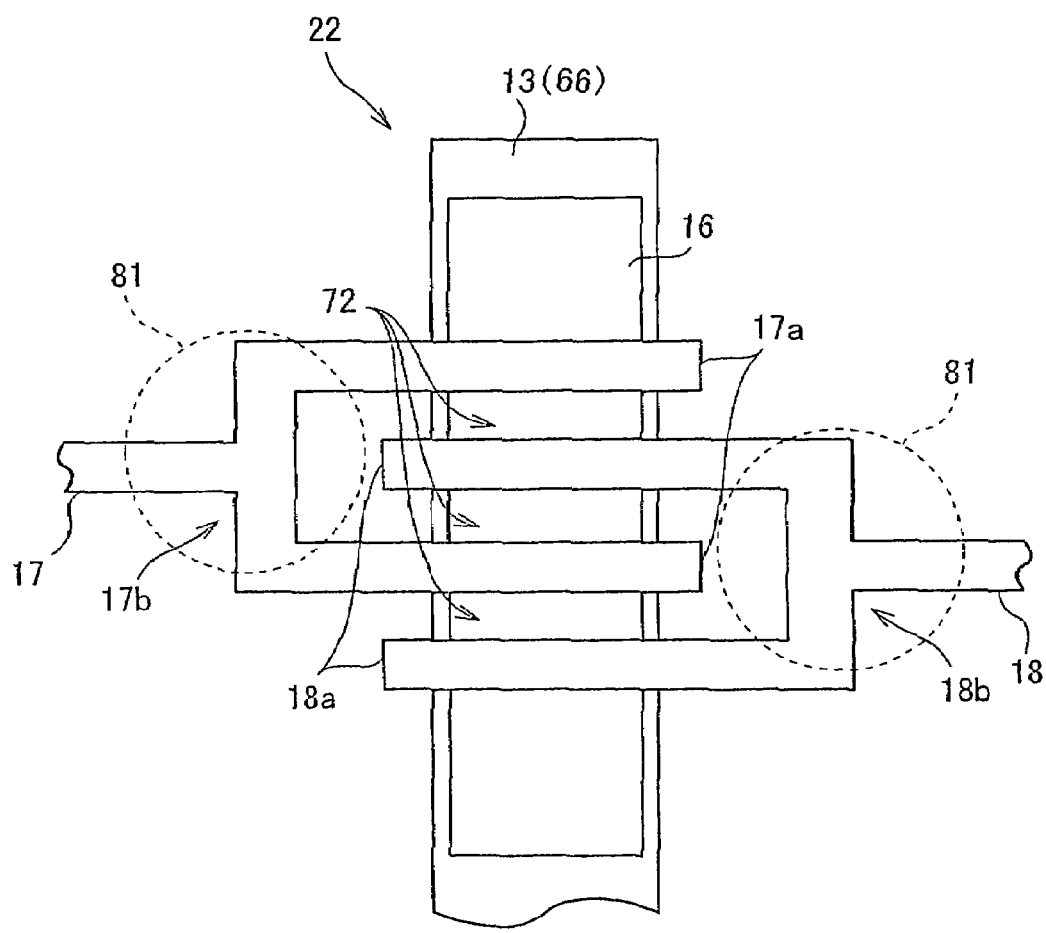
FIG. 1 is a plan view illustrating an arrangement of a TFT section of a TFT array substrate of one embodiment of the present invention.

An embodiment of the present invention is described below, referring to accompanying drawings.

A liquid crystal display apparatus of the embodiment of the present invention is provided with pixels shown in FIG. 2(a). Note that FIG. 2(a) is a plan view schematically illustrating an arrangement of one pixel in a TFT array substrate of a liquid crystal display apparatus. Moreover, a cross sectional view taken on line A-A of FIG. 2(a) is illustrated in FIG. 2(b).

As shown in FIGS. 2(a) and 2(b), in a TFT array substrate 11, gate electrodes 13 (gate wires) and source electrodes 17 (source wires) are provided in matrix on a glass substrate 12. Respectively between adjacent gate electrodes 13 (gate wires), storage capacitance electrodes 14 (storage capacitance wire) are provided.

Between a position of TFT section 22 and a position of a storage capacitance section 23, the TFT array substrate 11 is, as shown in FIG. 2(b), provided with one gate electrode 13 and one storage capacitance electrode 14, on the glass substrate 12.

Formed on the gate electrode 13 is a semiconductor layer 16 including an a-Si layer. Between the gate electrode 13 and the semiconductor layer 16, the gate insulation layer 15 is sandwiched. Each one end section (end) of a source electrode 17 and a drain electrode 18 is formed on the semiconductor layer 16. Each another end of the drain electrode 18 is on a position above the storage capacitance electrode 14, the position and the storage capacitance electrode 14 sandwiching the gate insulation layer 15. At the position, a contact hole 24 is formed. A protective layer 19 is formed on the source electrode 17 and the drain electrode 18. On the protective layer 19, a photosensitive acrylic resin layer 20 and a pixel electrode 21 are formed in this order.

The arrangement of the TFT section 22 is called as a bottom gate structure. The present invention is not limited to the bottom gate structure, and is also applicable to a top gate structure in which a gate electrode 13 is formed above the semiconductor layer 16 so that a gate insulating layer 15 is sandwiched between the semiconductor layer 16 and the gate electrode 13.

Therefore, in the TFT section 22 of the present invention, the semiconductor layer 16 is formed, which faces the gate electrode 13 via the gate insulation layer 15, and the source electrode 17 and the drain electrode 18, which are electrically connected with the semiconductor layer 16, are formed.

Figure 3:
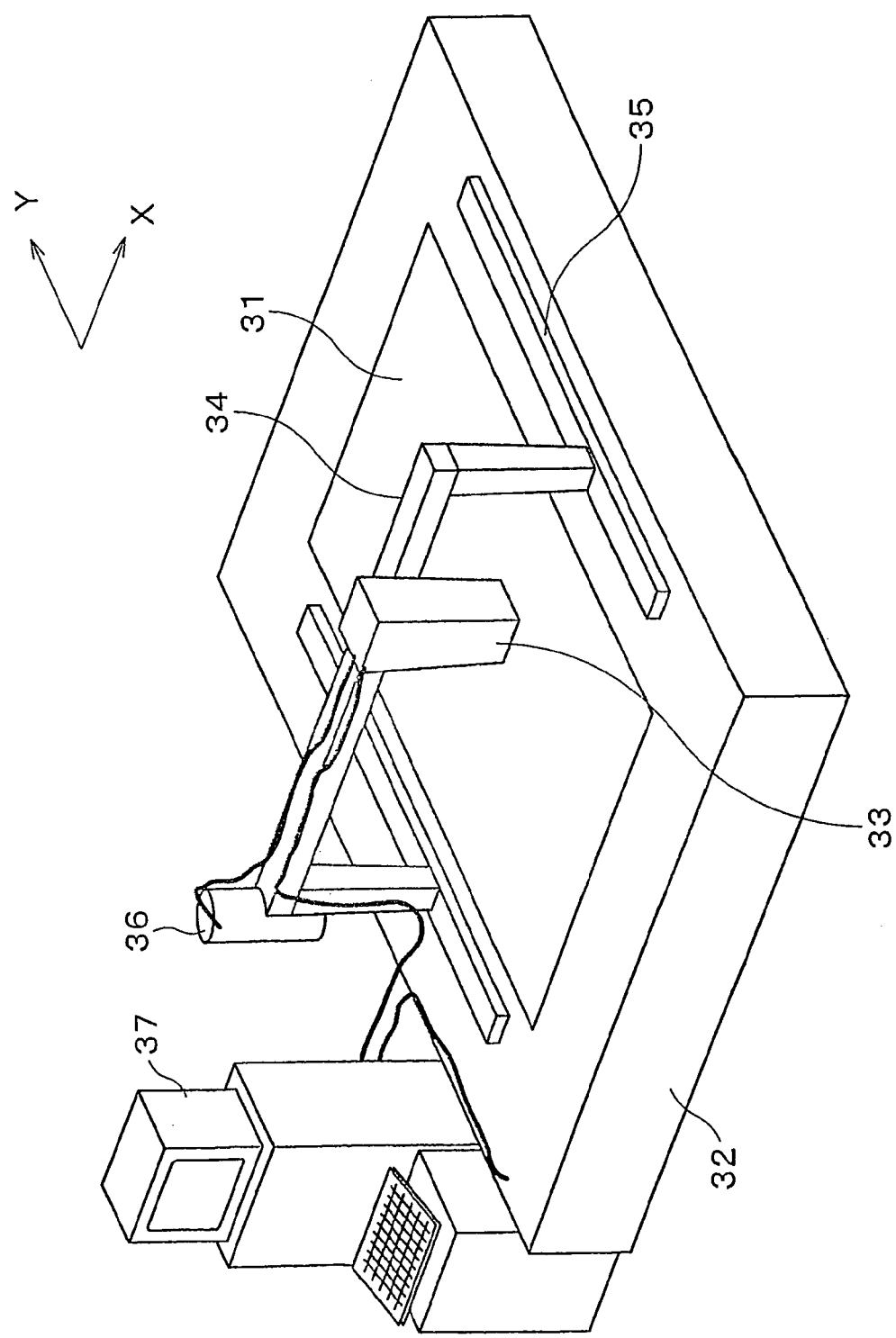
FIG. 3 a schematic perspective view illustrating a pattern formation apparatus of an ink jet method for use in manufacturing the liquid crystal display apparatus of the embodiment of the present invention.

In the present embodiment, the TFT array substrate 11 is manufactured, for example, by an ink jet method, by using a pattern formation apparatus for jetting or dropping raw materials of the layer to be formed. The pattern formation apparatus is, as shown in FIG. 3, provided with a table 32, an ink jet head 33, an X-direction driving section 34, and a Y-direction driving section 35. The table 32 is for placing thereon a substrate 31 (corresponding to the glass substrate 12). The ink jet head 33 is droplet jetting means for jetting onto the substrate 31 on the table 32, for example, flowable ink (droplets or flowable raw material) containing a wire raw material. The X-direction driving section 34 and the Y-direction driving section 35 respectively move the ink jet head 33 in an X direction and a Y direction.

Note that the X and Y directions are directions respectively in parallel to the X axis and the Y axis of two dimensional X-Y coordinate on a plane of the substrate 31.

Moreover, the pattern formation apparatus is provided with an ink supplying system 36, and a control unit 37. The ink supplying system 36 supplies the ink to the ink jet head 33, whereas the control unit 37 performs various controls such as jetting control of the ink jet head 33, driving control of the X-direction driving section 34 and the Y-direction driving section 35, and the like controls. The control unit 37 outputs dropping position information to the X- and Y-direction driving sections 34 and 35, and outputs jetting information to a head driver (not shown) of the ink jet head 33. Hereby, the ink jet head 33 operates in association with movement of the X- and Y-direction driving sections 34 and 35, and supplies a droplet in a target amount onto a target position (drop-on position) on the substrate 31.

The ink jet head 33 may be of a piezo method in which a piezo actuator is used, of a bubble method in which a heater is provided in the head, or of other methods. An amount of ink to be jetted from the ink jet heat 33 can be controlled by controlling a voltage applied thereto. The droplet jetting means may be replaced with means of a method of simply dropping droplets, or any means capable of supplying a droplet.

Next, a manufacturing method of the TFT array substrate 11 of the liquid crystal display apparatus.

Figure 4:
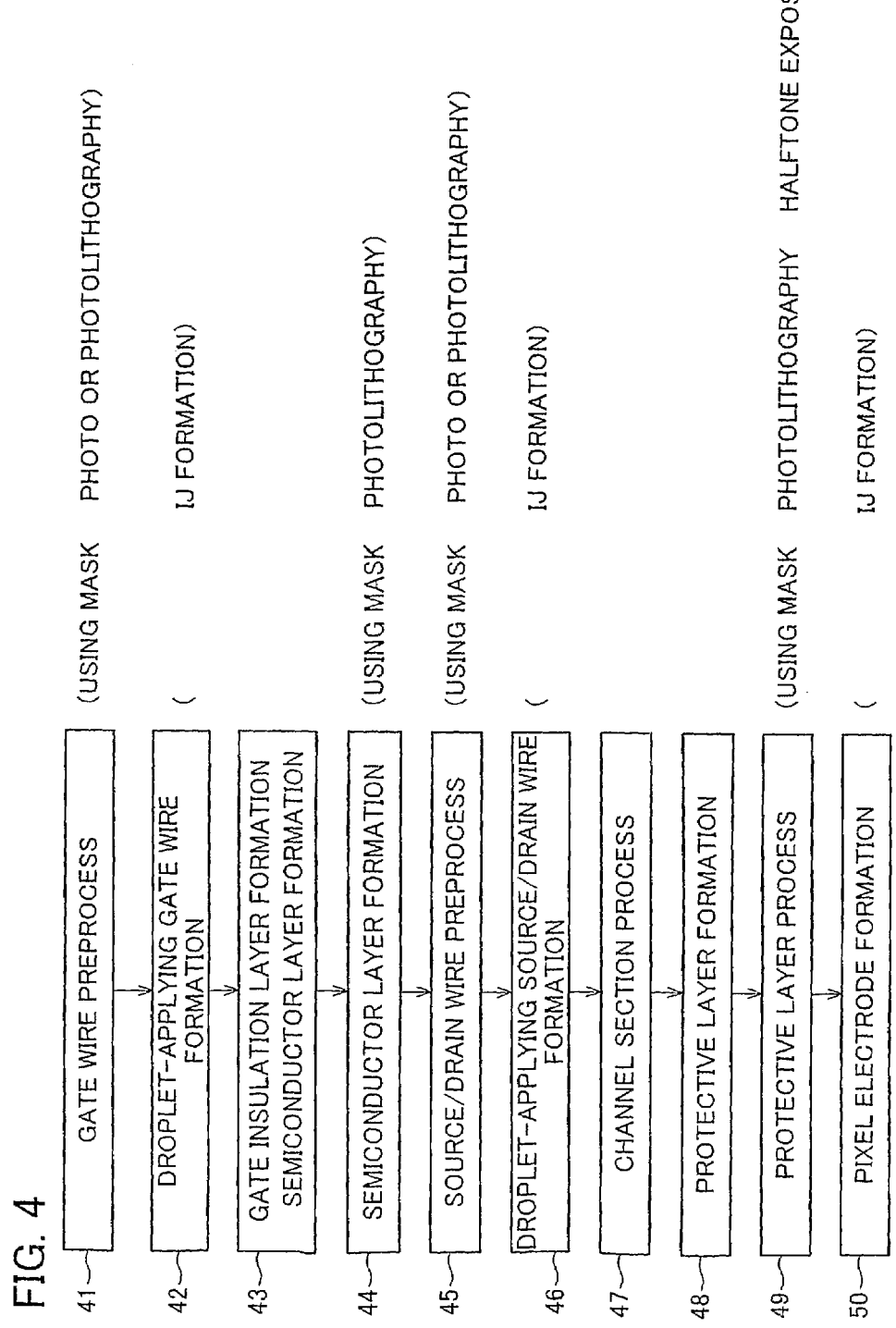
FIG. 4 is a flow chart illustrating manufacturing steps of the TFT array substrate shown in FIGS. 2(a) and 2(b).

In the present embodiment, the manufacturing method of the TFT array substrate 11 includes, as shown in FIG. 4, a gate preprocessing step 41, a droplet-applying gate wire formation step 42, a gate insulation layer formation/semiconductor layer formation step 43, a semiconductor layer formation step 44, a source/drain wire preprocessing step 45, a droplet-applying source/drain wire formation step 46, a channel section processing step 47, a protective layer formation step 48, a protective layer processing step 49, and a pixel electrode formation step 50.

[Gate Preprocessing Step 41]

In the gate preprocessing step 41, preprocess for the droplet-applying gate wire formation step 42 is carried out. In the droplet-applying gate wire formation step 42 following the gate preprocessing step 41, the gate wire is formed by dropping a liquid wire raw material by using the pattern formation apparatus. For this, in the gate preprocessing step 41, performed is process to prepare for attaining more appropriate application of the liquid wire raw material when the liquid wire raw material is jetted (dropped) onto a gate wire formation area 61 (shown in FIG. 5(a)) by the pattern formation apparatus. Note that FIG. 5(a) is a plan view of the glass substrate 12 provided in the TFT array substrate 11.

Roughly speaking, this step includes the following steps: a first step is a wetting/dewetting step of giving, to parts of the substrate (glass substrate 12), wetting or dewetting properties with respect to the liquid wire raw material, so as to pattern a hydrophilic area (wetting area) as a gate wire formation area 61 and a hydrophobic area (a dewetting area) as a non-gate wire formation area; and a second step is a step of forming, along a border of each gate wire formation area 61, a guide for controlling flow of the liquid wire raw material.

As the former, wetting/dewetting process by photocatalysis by using titanium oxide is a typical example. As the latter, the guide is formed by photolithography by using a resist. Further, in order to give a wetting property or dewetting property to the guide or a surface of the substrate, a step of exposing the guide or the surface of the substrate to a gas of CF4 and O2 in a plasma may be carried out. A resist is removed after the wire is formed.

Here, the photocatalysis using titanium oxide is carried out as follows. A mixture (dewetting raw material) of isopropyl alcohol and ZONYL FSN (product name: made by E. I. du Pont de Nemours and Co.), which is a non-ion type fluorochemical surfactant, is applied on the glass substrate 12 of the TFT array substrate 11. Moreover, onto the mask for the pattern of the gate wire, a mixture of ethanol and a raw material (titanium dioxide particulate dispersion raw material) in which titanium dioxide particulates are dispersed is applied by spin-coating, so as to form a photocatalysis layer. After that the glass substrate thus prepared is baked at a temperature of 150° C. Then, with the mask on, the glass substrate 12 is exposed to UV light. The exposure is carried out for 2 minutes by using ultraviolet light of 356 nm in an intensity of 70 mW/cm2.

Figure 12:
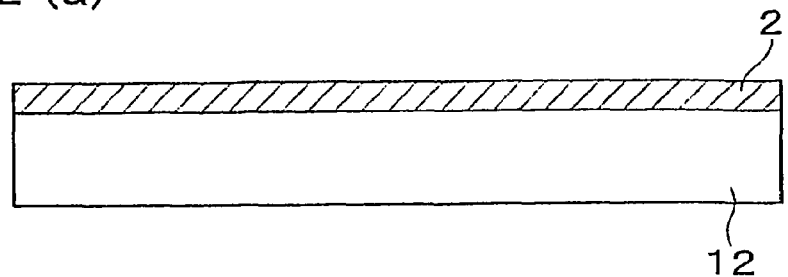
FIGS. 12(a) to 12(d) are explanation views illustrating a step of forming a wetting pattern in a dewetting area, by wetting process of the substrate by using a photocatalyst.
Figure 12:
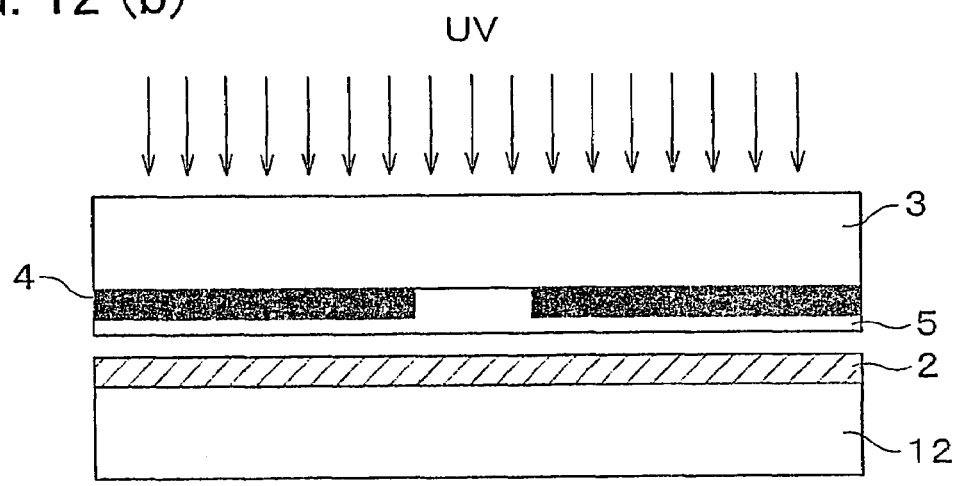
Figure 12:
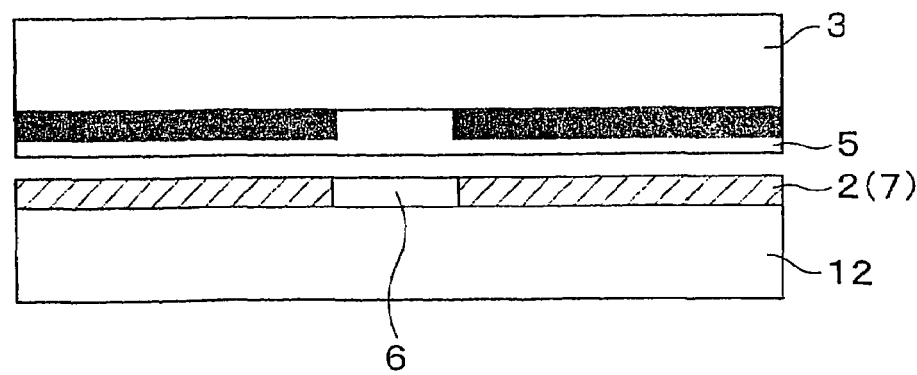
Figure 12:
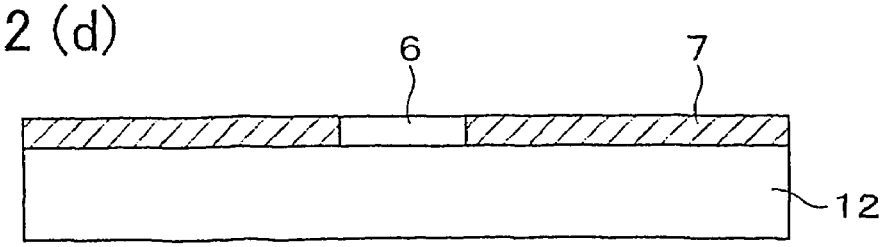

Referring to FIGS. 12(a) to 12(d), more detailed explanation is provided below. As shown in FIG. 12(a), by using the spin coat method and the like, the dewetting raw material is applied on the glass substrate 12. By drying the glass substrate 12, a wet layer 2 is formed. Note that silane coupling agent may be used as the dewetting raw material.

Next, as shown in FIG. 12(b), UV exposure is carried out under the above mentioned exposure condition, via a photo mask 3 in which a mask pattern 4 composed of chromium or the like and a photocatalyst layer 5 composed of a titanium oxide or the like are formed in advance.

As a result, as shown in FIGS. 12(c) and 12(d), wetting property of only part that is subjected to the UV exposure is improved. Hereby, a wet pattern 6 corresponding to the gate line formation area 61 is formed.

[Droplet-Applying Gate Wire Formation Step 42]

The droplet-applying gate wire formation step 42 is illustrated in FIGS. 5(b) and 5(c). FIG. 5(b) is a plan view of the glass substrate 12 after the storage capacitance electrode 14 is formed between the gate electrode 13 and the gate electrode 13 adjacent thereto. FIG. 5(c) is a cross sectional view taken on line B-B of FIG. 5(b).

Figure 5:
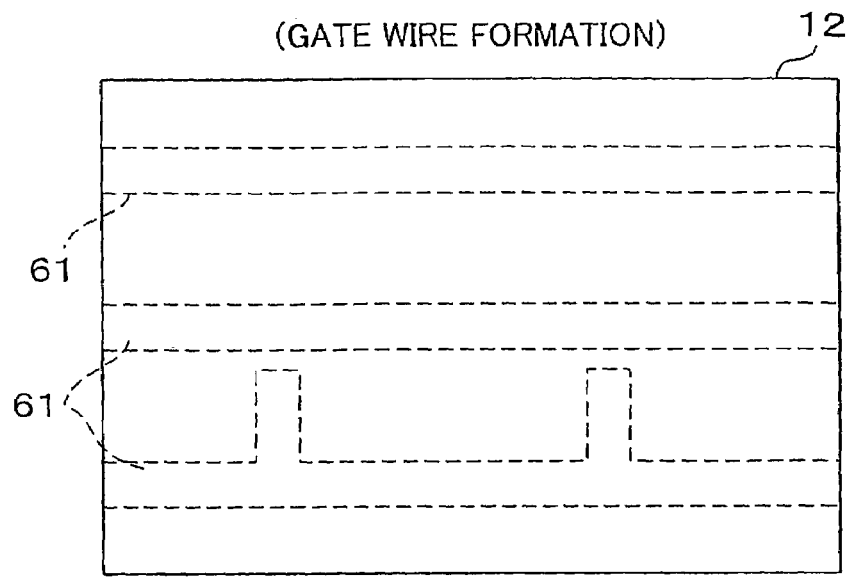
FIG. 5(a) is a plan view of the TFT array substrate, the plan view explaining a gate preprocessing step shown in FIG. 3.
FIG. 5(b) is a plan view of the TFT array substrate, the plan view explaining a droplet-applying gate wire formation step shown in FIG. 3. Further.
FIG. 5(c) is a cross sectional view taken on line B-B of FIG. 5(b).
Figure 5:
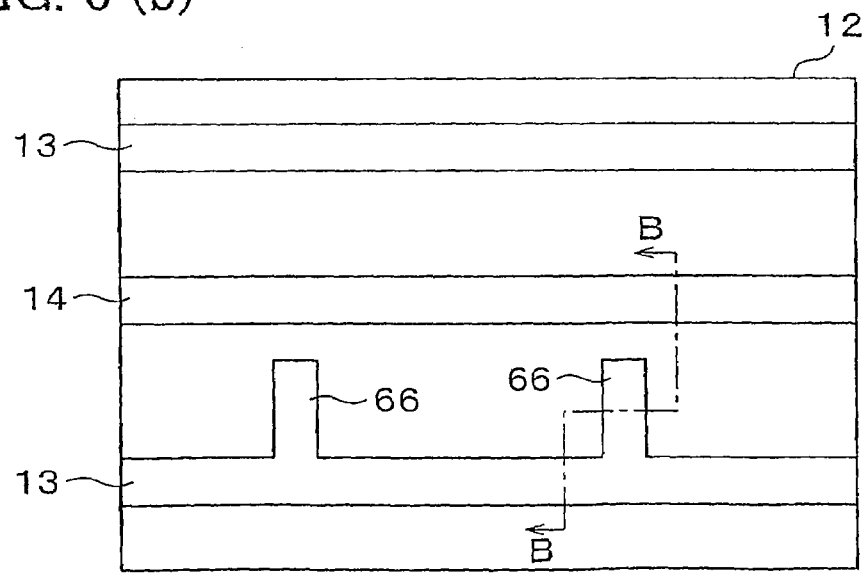
Figure 5:
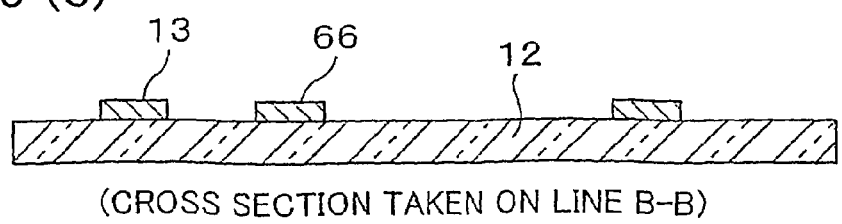

Note that as shown in FIG. 5(b), part of a certain gate electrode 13 is protruded toward the storage capacitance electrode 14 next to the certain gate electrode 13. The part will finally become TFT-section gate electrode 66, as shown in FIGS. 1 and 2(a). However, the TFT section gate electrode 66 of the upper one of the gate electrodes 13 shown in FIG. 5 is omitted for easy explanation.

In the droplet-applying gate wire formation step 42, by using the pattern formation apparatus, the wire raw material is applied (a droplet thereof is applied) on the gate wire formation area 61 on the glass substrate 12, as shown in FIGS. 5(b) and 5(c). As the wire raw material, used is a raw material in which Ag particulates coated with an organic film as a surface coating layer are dispersed in an organic solvent. It is set that a width of the wires is substantially 50 μm and an amount of the wire raw material to be jetted from the ink jet head 33 is 80 pl.

The wire raw material is jetted from the ink jet head 33 onto a wetted surface (a surface subjected to the wetting/dewetting process), and then the wire raw material flows and spreads over and within the gate wire formation area 61. Therefore, a jetting interval to jet the wire raw material onto the gate wire formation area 61 is set to 500 μm approximately. After the application, the glass substrate 12 is baked for one hour at 350° C., thereby forming the gate electrode 13 and the supplement capacitance electrode 14.

The temperature for baking is set at 350° C. because a process temperature of about 300° C. is applied in the next semiconductor layer formation step 44. Therefore, the baking temperature is not limited to the temperature. For example, in case where an organic semiconductor is to be formed, an annealing temperature may be set at a temperature of 100° C. to 200° C. In this case, the baking temperature may be set at a lower temperature of 200° C. to 250° C.

Moreover, as a wire raw material, it is possible to use particulates or a paste raw material in an organic solvent. the particulates or paste raw material may be made of solely a metal or an alloy such as Ag—Pd, Ag—Au, Ag—Cu, Cu, Cu—Ni, or the like, besides Ag. Further, as to the wire raw material, it is possible to obtain a desired resistance value and a surface condition by controlling a dissociation temperature of an organic raw material contained in an organic solvent or the surface coating layer protecting the particulates, in accordance with a baking temperature necessary. Note that the dissociation temperature is a temperature at which the surface coating layer and the organic solvent is evaporated.

[Gate Insulation Layer Formation/Semiconductor Layer Formation Step 43]

The gate insulation layer formation/semiconductor layer formation step 43 is illustrated in FIG. 6(a).

In the gate insulation layer formation/semiconductor layer formation step 43, the gate insulation layer 15, an a-Si film formation layer 64 and an n+ film formation layer 65 are formed sequentially and continuously by CVD on the glass substrate 12 that has been subjected to the droplet-applying gate wire formation step 42. The a-Si film formation layer 64 is formed by a CVD (Chemical Vapor Form) method. The gate insulation layer 15, the a-Si film formation layer 64, and the n+ film formation layer 65 are respectively 0.3 μm, 0.15 μm, and 0.05 μm in thickness, and are formed (deposited) without spoiling a vacuum condition, (that is, with vacuum condition maintained). The layer formation (deposition) is carried out at a temperature of 300° C.

[Semiconductor Layer Formation Step 44]

The semiconductor layer formation step 44 is illustrated in FIGS. 6(b) to 6(e). FIG. 6(e) is a plan view illustrating the glass substrate 12 that has been subjected to the semiconductor layer formation step 44. FIG. 6(d) is a perspective view taken on line C-C of FIG. 6(e). FIGS. 6(b) to 6(c) are vertical cross sectional views taken on the same wire as FIG. 6(d), illustrating each step in the semiconductor layer formation step 44.

In the semiconductor layer formation step 44, the resist raw material is applied onto the n+ film formation layer 65, and then the resist raw material is processed via a photolithography step and an etching step, thereby forming a resist layer 67 having a shape of the semiconductor layer 16, as shown in FIG. 6(b).

Next, dry-etching is performed on the n+ film formation layer 65 and the a-Si film formation layer 64 by using a gas (for example SF6+HCl), as shown in FIG. 6(c), thereby forming an n+ film 69 and an a-Si layer 68. Thereafter, the glass substrate 12 is washed with an organic solvent, thereby peeling off and removing the resist layer 67, as shown in FIG. 5(d).

[Source/Drain Wire Preprocessing Step 45]

In the source/drain wire preprocessing step 45, a wire guide is formed along outline of an area (source formation area/drain formation area) in which the source electrode 17 and the drain electrode 18 shown in FIG. 1 are formed respectively.

Here, the source electrode 17 and the drain electrode 18, which correspond to the source wires and drain wires arranged in matrix, and the source electrode 17 and the drain electrode 18 located on the TFT section 22 are formed at the same time. Thus, the source/drain formation area includes the formation area of the source wires and the drain wires.

The wire guide is made of a photoresist raw material. Specifically, a photoresist is applied onto the glass substrate 12 that has been subjected to the semiconductor formation step 44. Then, the glass substrate is prebaked. After that, the glass substrate is exposed using a photomask so as to be developed. Next, the wire guide is formed by performing postbaking. The wire guide thus formed has a width of about 10 µm, here. A width of a groove formed by the wire guide (a width of the wire formation area) is about 10 µm.

Note that the SiNx surface (a top surface of the gate insulation layer 15) is subjected to a wetting process by using oxygen plasma, so that a wire raw material will be well associated with a surface that is to be under the wire raw material applied thereon by the pattern formation apparatus. Meanwhile, the wire guide is subjected to dewetting process by flowing a CF4 gas in the plasma.

The wetting/dewetting process is basically identical to the wetting/dewetting process disclosed in Japanese Patent Application, Tokukai, No. 2000-353594 (European Patent Application EPO 989778 A1). The wire guide is given the dewetting property because a surface layer of the photoresist raw material (organic resin) is modified with F (fluorine). Instead of the CF4 gas, a CF6 gas may be used.

Moreover, instead of forming the wire guide, wetting/dewetting process using photocatalysis for the formation of the gate electrodes may be adopted to perform wetting and dewetting in accordance with the wire electrode pattern (so as to form the wetting area as source/drain wire formation area, and the dewetting area as a non-source/drain wire formation area).

[Droplet-Applying Source/Drain Wire Formation Step 46]

In the droplet-applying source/drain wire formation step 46, the wire raw material is applied (a droplet thereof is applied), by the pattern formation apparatus, onto the source/drain formation area thus formed by using the wire guide. Hereby, the source electrode 17 and the drain electrode 18 are formed. Here, the amount of the wire raw material to be jetted out from the ink jet head 33 is set at 2 pl. Moreover, Ag particulates are used as the wire raw material. Thickness of the layer to be formed is set at 0.3 µm. Moreover, the baking temperature is set at 200° C. After the baking, the wire guide is removed by using an organic solvent.

Note that the wire raw material may be the same as the one used for the gate electrodes 13. However, because the a-Si layer is formed at a temperature of about 300° C., it is necessary that the baking be carried out at a temperature not more than 300° C.

[Channel Section Processing Step 47]

Here, a channel section 72 of the TFT is processed. Firstly, the wire guide is removed by using an organic solvent. Alternatively, the wire guide for the channel section 72 is removed by ashing. Next, the n+ layer 69 is oxidized by ashing or laser oxidation, so as to render the n+ layer 69 insulative.

[Protective Layer Formation Step 48, Protective Layer Processing Step 49]

In the protective layer formation step 48 and the protective layer processing step 49, firstly a SiO$_2$ layer, which is to be the protective layer 19 (see FIG. 2(b)), is formed by CVD on the glass substrate 12 that has been processed up to formation of the source and drain electrodes. Next, on the SiO$_2$ layer an acrylic resin, which is to be the photosensitive acrylic resin layer 20, is applied so as to form a pixel electrode formation pattern and electrode processing pattern on the resist layer.

The pattern is so formed that the mask has (i) part from which the whole resist layer therein will be removed after development, and (ii) part from which a substantial upper half of the resist layer therein with respect to thickness will be removed after development. The latter is an area for halftone exposure in which transmissivity is about 50%.

Specifically, the protective layer 19 and the photosensitive acryl resin layer 20 are etched so as to remove the whole resist layer from that part in which an end surface will be formed within the contact hole 24, and so as to reduce the thickness of the resist layer in that part in which the pixel electrode 21 is to be formed. As a result of the reduction of the thickness of the resist layer in this part, the thickness of the resist layer is rendered to be half of the thickness of the thus applied resist layer, so that part surrounding the pixel electrode formation pattern in the photosensitive acryl resin layer 20 will become a guide shown in FIG. 2(b).

Next, by using the resist layer as a mask, the protective layer 19 located at an end section, and the photosensitive acryl resin layer 20 are removed by dry-etching.

[Pixel Electrode Formation Step 50]

On the pixel electrode forming pattern of the photosensitive acryl resin layer 20, an ITO particulate raw material, which is to be a pixel electrode raw material, is applied by using the pattern formation apparatus. Thereafter, the thus processed glass substrate 12 is baked at a temperature of 200° C., thereby forming the pixel electrode 21. In this way, the TFT array substrate 11 is obtained.

As described above, according to the present manufacturing method of the TFT array substrate 11, a number of masks is reduced, and the photolithography step and a number of vacuum layer formation apparatus can be significantly decreased, compared with a conventional manufacturing method in which the pattern formation apparatus using the ink jet method is not adopted. This leads to a dramatic reduction in cost of equipment to be invested.

Note that it is possible to produce the TFT array substrate 11 including a TFT section 22 having a bottom gate structure by the manufacturing step described above. However, the manufacturing step is changed as shown in the flow chart of FIG. 18 for manufacturing a TFT array substrate 11 including a TFT section 22 having a top gate structure.

The steps 121 to 132 shown in FIG. 18 are respectively associated with the reference numerals of the steps 41 to 50 that respectively correspond thereto.

In the manufacturing step of the top gate structure, the formation of the gate electrode 13 is carried out after the formation of the source electrode 17 and the drain electrode 18 and the formation of the semiconductor layer 16. However, the steps 121 to 132 are basically identical to the steps 41 and 50 respectively corresponding thereto, in terms of what is carried out.

However, the gate insulation layer formation/semiconductor layer formation step 43 is divided into the semiconductor n+ layer formation step 123, the semiconductor n+ layer formation (processing) step 124, the semiconductor layer (a-Si layer) formation step 125, the semiconductor layer formation (processing) step 126, and the gate insulation layer formation step 127.

In each of the semiconductor n+ layer formation (processing) step 124 and the semiconductor layer formation (process) step 126, as described in the explanation of the formation of the semiconductor layer 16, the dry etching may be carried out in which the resist formed in the photolithography step and the etching step is used as a mask.

Next, a method of forming the source electrode 17 and the drain electrode 18 in the TFT section 22 is further described.

Figure 2:
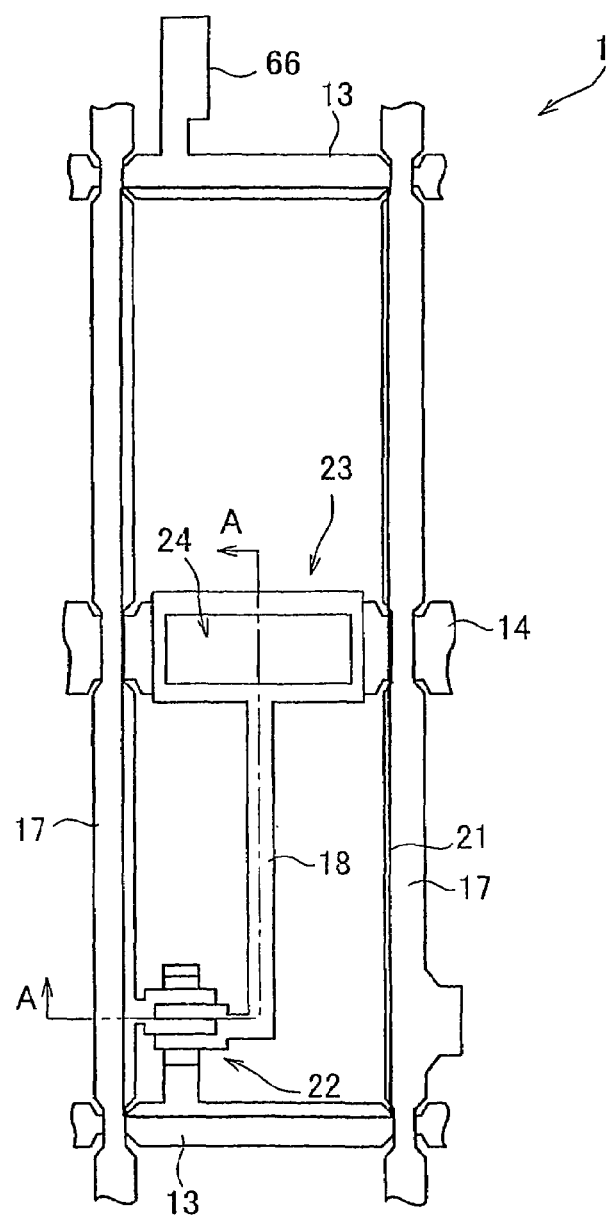
Figure 2:
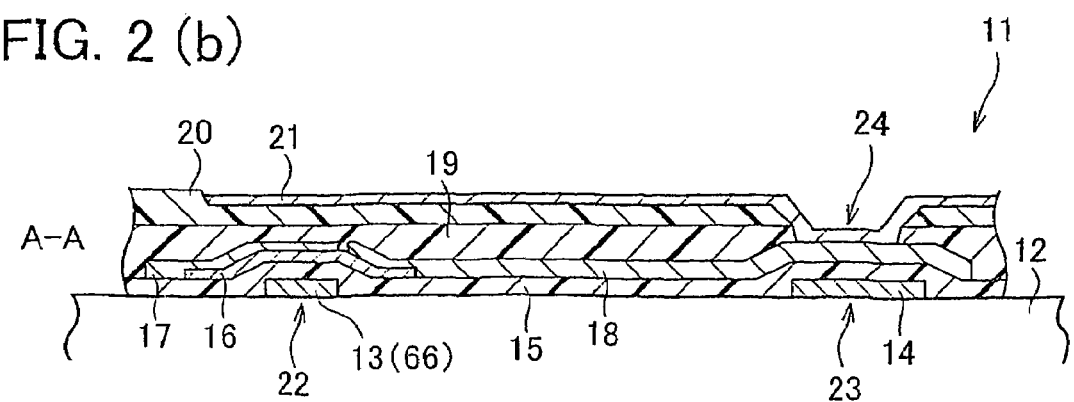

The source electrode 17 and the drain electrode 18 are so formed as to cross the TFT-section gate electrode s 66, as shown in FIG. 1 and FIG. 2(*a*). In the arrangement shown in FIG. 1, the source electrode 17 and the drain electrode 18 are branched into a plurality of branches (branch electrodes) in the TFT section 22. In other words, the source electrode 17 and the drain electrode 18 respectively have a branch section (17*a* or 18*a*) having the plurality of branch electrodes. Specifically, the source electrode 17 is provided with the branch electrode section 17*a*, whereas the drain electrode 18 is provided with the branch electrode section 18*b*. The branch electrodes of the branch electrode section 17*a* of the source electrode 17 and the branch electrodes of the branch electrode section 18*b* of the drain electrode 18 are arrayed alternately. Gaps between adjacent branch electrodes of branch electrode section 17*a* and 18*b* are the channel section 72. The branch electrodes of the branch electrode sections 17*a* and 18*a* have a width of 10 μm, for example. The channel section 72 has a width (a distance between the branch electrode sections 17*a* and 18*b*) of 10 μm, for example.

In case where the source electrode 17 and the drain electrode 18 of the TFT section 22 are formed by dropping an electrode raw material from the pattern formation apparatus, a minute droplet of the wire raw material is applied onto each electrode, or a droplet of the wire raw material is applied over a plurality of wires.

Here, the wires usually have a width of several μm. In order to realize droplets having a diameter of several μm, it is necessary for the pattern formation apparatus to jet an amount much smaller than 1 pl. However, it is difficult to realize such a diameter of droplets. Moreover, even if such diameter of droplets is realized, it is difficult to drop the minus droplets onto 2 to 3 millions of TFT sections 22 in the liquid panel, considering time required and a life of the ink jet head 33. Therefore, a droplet having a diameter larger than several μm is dropped (applied).

In this case, if the droplet is directly applied onto the electrodes (branch electrodes of the branch electrode sections 17*a* and 18*a*) of the channel section 72, the droplets might splash, so that the wire raw material will adhere onto the channel section 72, or the wire raw material will remain.

In case the wire raw material remains on the channel section 72, the remaining wire raw material acts as a mask in etching the n+ layer 69 of the channel section 72, thereby leaving the n+ layer 69. This causes leakage between the source electrode 17 and the drain electrode 18.

Figure 13:
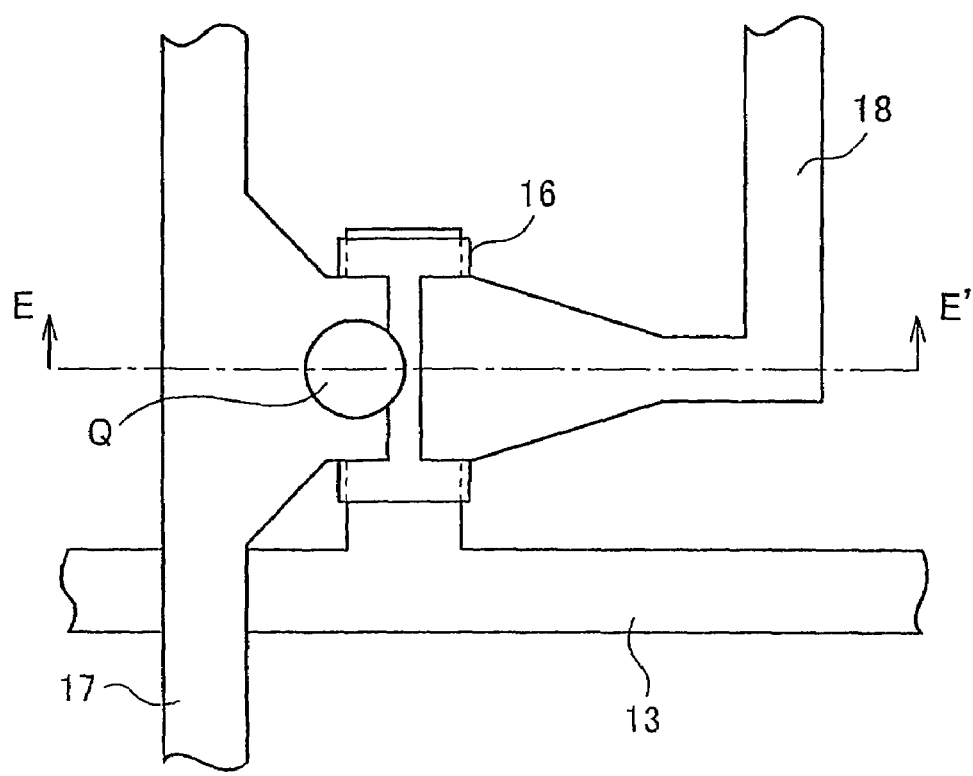
FIG. 13 is a plan view showing a condition in which a splashed droplet of an electrode raw material remains on part of the channel section of the source electrode.

Production of the channel section 72 is described below, so as to explain the cause of the leakage. FIG. 14(*a*), which is a cross sectional view taken on line E-E' of FIG. 13, illustrates a condition before the source and drain electrodes are formed. Here, a guide 200 has just formed after a semiconductor layer 16 composed of the a-Si layer 68 and n+ layer 69 is formed. The guide 200 is for separating the source electrode 17 and the drain electrode 18 on the channel section 72.

Note that in this sectional view, only the part upper from the gate insulating layer 15 in which the semiconductor layer 16 will be formed, and the gate electrode 66 is omitted here.

FIG. 14(*b*) illustrates a next condition after the raw material of the source electrode 17 and the drain electrode 18 is applied and baking is carried out. FIG. 14(*c*) shows a following condition after the guide 200 is removed by using an organic solvent, or by ashing. In this condition, the n+ layer 69 still exists on the semiconductor layer 16. If the n+ layer 69 remains as such, application of a voltage on the source electrode 17 and the drain electrode 18 easily causes a current flow due to a carrier that the n+ layer has.

Therefore, it is necessary that the n+ layer 69 be removed. For removing the n+ layer 69, dry-etching using a gas such as SF6 +HCl, or the like. Moreover, instead of the removal of the n+ layer 69, the n+ layer 69 may be converted into a nonconductor by ashing or laser oxidation.

FIG. 14(*d*) illustrates a condition after the n+ layer 69 is removed. In this way, the production of the channel section 72 is completed.

Here, in case the electrode raw material remains on the guide 200 of the channel section 72, the removal of the n+ layer 69 or the conversion of the n+ 69 layer into the nonconductor is not sufficiently carried out.

For example, FIG. 13 shows a case where the electrode raw material remains on part of the channel section 72 on a side associated with the source electrode 17. FIG. 14(*e*) illustrates a cross section taken on line E-E'. If a residual (Q) of the electrode raw material remains on the guide 200 as shown in FIG. 14(*e*), there is a possibility that the residual (Q) acts as a mask in the step of removing the guide 200, as shown in FIG. 14(*f*), so that part of the guide 200 remains. This may occur similarly in case of the process using the organic solvent, or in case of the peeling-off by ashing.

As shown in FIG. 14(*f*), if part of the guide 200 remains on the channel section 72, the n+ layer 69 cannot be completely removed in an area in which the residual (Q) exists (part of the n+ layer 69 in the area in which the residual (Q) exists is not removed sufficiently), in the next step of removing the n+ layer 69, as shown in FIG. 14(*g*). Similarly, in the step of converting the n+ layer 69 into a nonconductor by ashing or laser oxidation, the part of the part of the n+ layer 69 in the area in which the residual (Q) exists is not converted into a nonconductor sufficiently.

Figure 15:
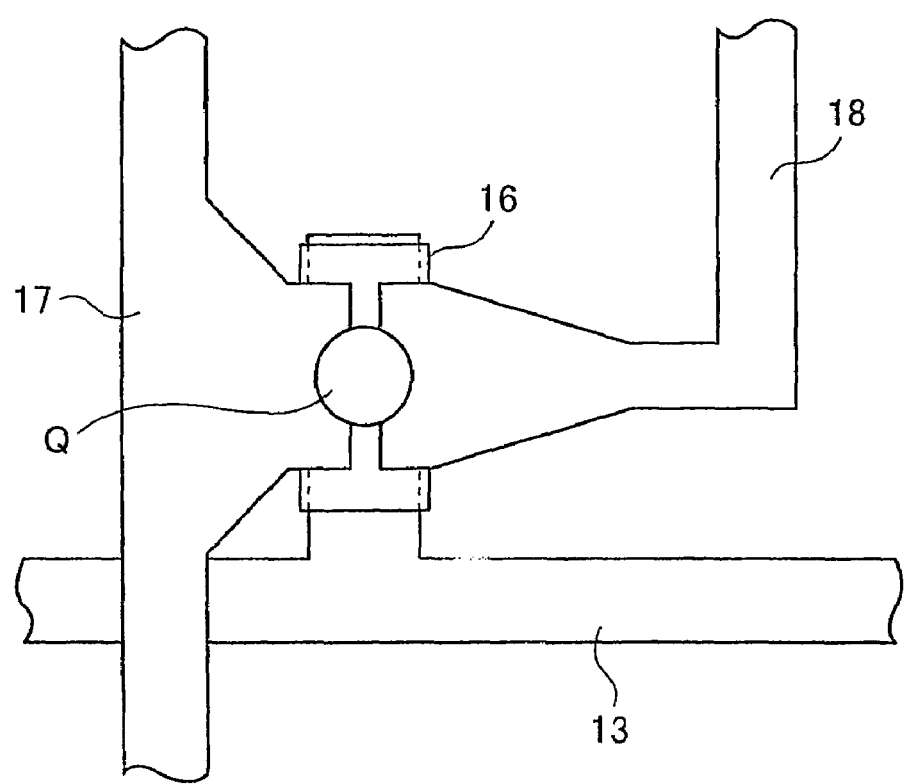
FIG. 15 is a plan view illustrating a condition in which a splash droplet of the electrode raw material remains and covers the channel section between the source electrode and the drain electrode.

As described above, the residual (Q) causes the n+ layer 69 to remain on the channel section 72. Therefore, if the residual (Q) bridges the source and drain electrodes 17 and 18 as shown in FIG. 15, a leak current flows between the source and drain electrodes 17 and 18. Of course, in this part, the n+ layer 69 remains. Thus, even if the residual (Q) is removed after the process for the n+ layer 69 is completed, a current flows between the source and drain electrodes 17 and 18 via the n+ layer 69. Therefore, a leakage is caused between the source and drain electrodes 17 and 18.

As described above, it is important to avoid formation of the residual (Q) in forming the source and drain electrodes 17 and 18.

Therefore, in case where the source and drain electrodes 17 and 18 are formed in the TFT section 22, the droplets of the wire raw material are dropped in part of the area in which the source electrode 17 and the drain electrode 18 are formed, but avoiding part in which the channel section 72 (semiconductor layer 16) are formed. Specifically, in case where the source electrode 17 and the drain electrode 18 have the branch electrode sections 17*a* and 18*a* as described above, positions respectively corresponding to branching-off parts 17b and 18b are drop-on positions 81 (on which the droplets are dropped).

Moreover the drop-on positions 81 are set considering how accurately the pattern formation apparatus can apply (drop) the droplet (application accuracy). Within the drop-on positions 81, the branching-off positions 17b and 18b are positioned respectively.

The application accuracy of the pattern formation apparatus, that is, a shift length from the drop-on position that is targeted, to a position to which the droplet is actually applied, depends on (i) production error of the ink jet head 33, (ii) an amount of droplets adhered on a head nozzle, (iii) evenness the droplets in amount, (iv) accuracy of the driving and positioning of the ink jet head 33 repeated by the X-direction driving section 34 and the Y-direction driving section 35, (v) heat expansion of the ink jet head 33, (vi) speed of the movement of the ink jet head 33 in jetting, and (vii) the like factors. Moreover, the application (dropping) of the droplets by the pattern formation apparatus is carried out with, for example, an accuracy of ±3 μm to ±5 μm in case where one nozzle jets out the droplets while the nozzle is not moved. In case of a multi nozzle, the application of the droplets by the pattern formation apparatus is carried out with, for example, an accuracy of ±10 μm to ±15 μm while the multi nozzle is not moved.

In the present embodiment, an amount of one droplet is set to 4 pl, considering that a plurality of wires are formed from one droplet, and that the electrode having a width of 10 μm is formed from a droplet having a diameter larger than the width of the electrodes, as well as how long a head life and tact time of the ink jet head 33 are. When one droplet has this amount, the diameter of the droplet in dropping (when the droplet hits the surface of the glass substrate 12) is about 20 μm. Therefore, it is preferable that a ratio between (i) the width of the branch electrode sections 17a and 18a and (ii) the diameter of the droplet in dropping is substantially 1:2.

Figure 7:
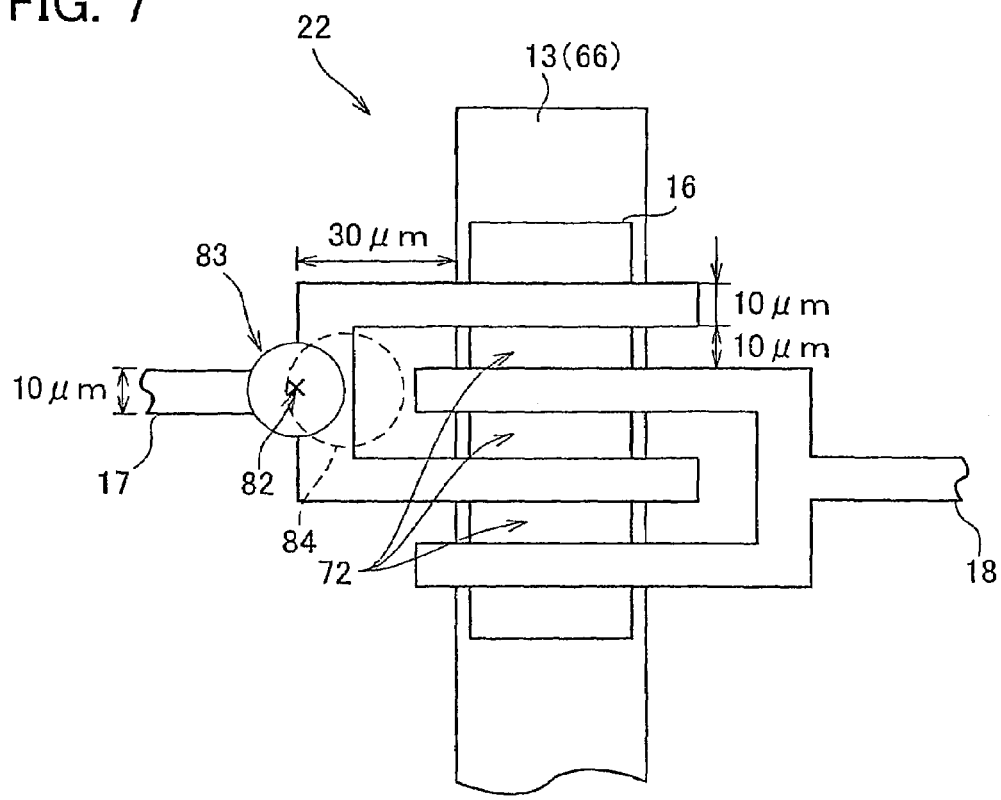
FIG. 7 is a plan view showing sizes of parts of the TFT section shown in FIG. 1, and allowance range with respect to a desired drop-on position.

Moreover, taking those conditions into consideration, the drop-on positions 81 are located in positions respectively distanced by 30 μm from edges of the semiconductor layer 16 (a-Si layer 68), as shown in FIG. 7. Note that in FIG. 7, the reference numeral 82 denotes a drop-on center of the drop-on positions 81, and the reference numeral 83 denotes an drop-on center allowance range, which is within 15 μm from the drop-on center 82. The reference numeral 84 shows a drop-on position (with a diameter of droplet of 20 μm) for a case where the droplet is applied in a position distanced (shifted) by 15 μm from the drop-on position 81 (the drop-on center 82) toward the channel section 72.

As described above, by forming the source electrode 17 and the drain electrode 18 by applying (dropping) the droplets in the drop-on positions 81 distanced from the channel section 72, the splash droplet of the wire raw material will not adhere on the TFT, that is, the channel section 72, thereby preventing the leakage between the source electrode 17 and the drain electrode 18. Therefore, in case where the source electrode 17 and the drain electrode 18 are formed by dropping the droplet of the wire raw material, it is possible to attain stable TFT characteristics.

Second Embodiment

Another embodiment of the present invention will be described below, referring to drawings.

Figure 8:
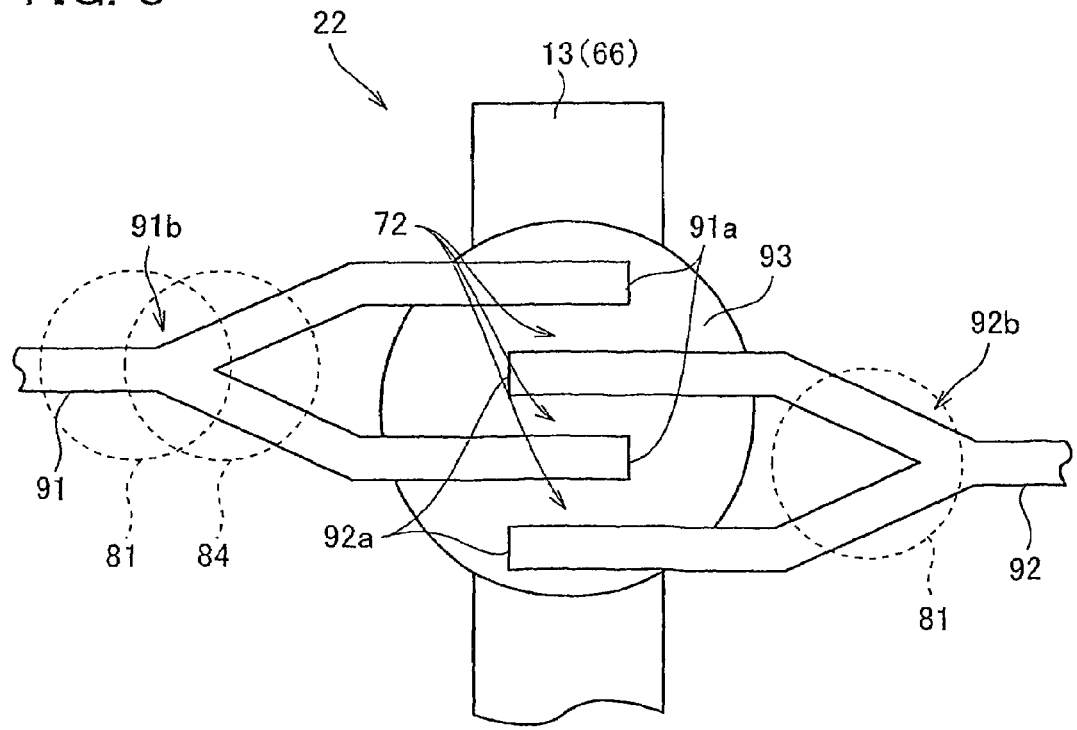
FIG. 8 is a plan view illustrating an arrangement of a TFT section of a TFT array substrate of another embodiment of the present invention.

In the present embodiment, a TFT section 22 of a TFT array substrate 11 (see FIG. 2(a)) is arranged as shown in FIG. 8. The TFT section 22 is provided with a source electrode 91 and a drain electrode 92, instead of the source electrode 17 and the drain electrode 18 described above. Moreover, a semiconductor layer 93, which replaces the semiconductor layer 16, has a substantially circular shape, that resembles the shape of the droplet applied (dropped on).

The source electrode 91 and the drain electrode 92 are respectively provided with branch electrode sections 91a and 92a, as in the source electrode 17 and the drain electrode 18. The branch electrode sections 91a and 92a are branched, for example, into two branches (having two branch electrodes), respectively at branching-off parts 91b and 92b. Note that the number of branches (branch electrodes) may be set arbitrarily.

As explained so far, in the arrangement shown in FIG. 1, the branch electrodes of the branch electrode section 17a of the source electrode 17 and the branch electrodes of the branch electrode section 18a of the drain electrode 18 are firstly extended, from the branching-off parts 17b and 18b, in parallel to directions along which the TFT-section gate electrode 66 is protruded from the gate electrode 13 (respectively in opposite two directions). Then, the branch electrodes of the branch electrode sections 17a and 18a are extended, above the TFT-section gate electrode 66, in direction perpendicular to the directions along which the TFT-section gate electrode 66 is protruded.

On the other hand, in an arrangement shown in FIG. 8, the branch electrodes of the branch electrode section 91a of the source electrode 91 and the branch electrodes of the branch electrode section 92a of the drain electrode 92 are extended in oblique directions (two directions) so as to widen a gap between the branch electrodes of the branch electrode section 91a, and to widen a gap between the branch electrodes of the branch electrode section 92a. Then, the branch electrodes of the branch electrode sections 91a and 92a are extended, above the TFT-section gate electrode 66, in direction perpendicular to the directions along which the TFT-section gate electrode 66 is protruded.

In other words, the branch electrode sections 91a and 92a have parallel parts being parallel to each other and on the semiconductor layer 93, the branch electrodes of the branch electrode sections 91a and 92a being linear between the parallel parts and the branching-off part (91b or 92b).

Moreover, as described above, in the present embodiment, the semiconductor layer 93 is in a substantially circular shape resembling the shape of the applied droplet. Explained below is a manufacturing method of a TFT array substrate 11 of this case.

This manufacturing method is identical to the method described in the first embodiment, from a gate preprocessing step 41 to a gate insulation layer formation/semiconductor layer formation step 43 (see FIG. 9(a)), and from a source/drain wire preprocessing step 45 after a semiconductor layer formation step 44, to a pixel electrode formation step 50. The semiconductor layer formation step 44 is carried out as follows.

The semiconductor layer formation step 44 is illustrated in FIGS. 9(b) to 9(e). FIG. 9(e) is a plan view illustrating a glass substrate 12 that has been subjected to the semiconductor layer formation step 44. FIG. 9(d) is a cross sectional view taken on line D-D of FIG. 9(e), and FIGS. 9(b) and 9(c) are vertical cross sectional views taken on line D-D of FIG. 9(e), as in FIG. 9(d).

In the semiconductor layer formation step 44, as shown in FIG. 9(b), by a pattern formation apparatus, heat-curable resin is applied as a resist raw material onto an n+ film formation layer 65 located on the TFT-section gate electrode (branch electrode section) 66 branched off from the gate electrode 13, so as to adhere the heat-curable resin thereon. A resist layer 94 formed in this way is a pattern to be used for the process. For example, one droplet of the resist raw material of 10 pl is jetted out. Hereby, formed at a predetermined position on the TFT-section gate electrode 66 is a pattern having a circular shape having a diameter of about 30 μm. The thus prepared substrate is baked at a temperature of 150° C. As the heat-curable resin for the resist layer 94, used is resin in resist TEF series made by Tokyo Ohka Kogyo Co. Ltd. The resin in resist TEF series is used after adjusted in viscosity so as to be suitable for ink jetting.

Note that UV (ultra violet) resin or a photoresist may be used as the raw material of the resist layer 94, besides the heat-curable resin. Moreover, if the resist layer 94 was transparent, such transparent resist layer 94 would allow to check where the layer or the like is formed, while it is not necessary that the resist layer 94 be transparent. Further, it is preferable that the resist layer 94 has thermal resistance against a temperature in dry-etching, gas resistance against gas for use in dry-etching, and etching selectivity with respect to a raw material to be etched.

Next, by using a gas (for example, SF6+HCl), as shown in FIG. 9(c), an n+ film formation layer 65 and an a-Si film formation layer 64 are dry-etched so as to form an n+ layer (film) 69 and an a-Si layer (film) 68. Thereafter, the glass substrate 12 is washed with an organic solution, so as to peel off and remove the resist layer 94 as shown in FIG. 9(d).

As described above, in the semiconductor layer formation step 44, the shape of the semiconductor layer 93 composed of the n+ layer 69 and the a-Si layer 68 is reflection of the pattern of the resin jetted out from the pattern formation apparatus (pattern of the resist layer 94). Therefore, the semiconductor layer 93 is formed in a circular pattern or a quasi-circular pattern made of a curve, just as the droplet of the raw material of the resist layer 94 is shaped when the droplet is applied (dropped) on the glass substrate 12 from the ink jet head 33.

Note that, in case the semiconductor layer 93 has such a shape that the semiconductor layer 93 is out of the area of the TFT-section gate electrode 66, as described above, it is necessary that no end of the branch electrodes of the branch electrode sections 91a and 92a be out of an area (forming area) of the TFT-section gate electrode 66 (an area within which the TFT-section gate electrode 66 exists) (in other words, the end be within the area of the TFT gate electrode 66).

In FIG. 8, the semiconductor layer 93 has such a shape that is extended beyond edges of the TFT-section gate electrode 66, unlike the TFT-section gate electrode 66 and the semiconductor layer 16 shown in FIG. 7. Because of this, it is preferable that the ends of the branch electrode sections 91a and 92a (ends of the branch electrodes of the branch electrode sections 91a and 92a) are inside of edge surface lines of the TFT-section gate electrode 66, that is, on the TFT-section gate electrode 66. This is because the leak current is increased and the TFT characteristics are deteriorated, if the source and drain electrodes 17 and 18 are extended out of the TFT-section gate electrode 66.

In the following, mechanism of the occurrence of the leak current shown in the droplet-applying source/drain wire formation step 46 is described, referring to FIGS. 16(a), 16(b), 17(a), and 17(b).

Figure 16:
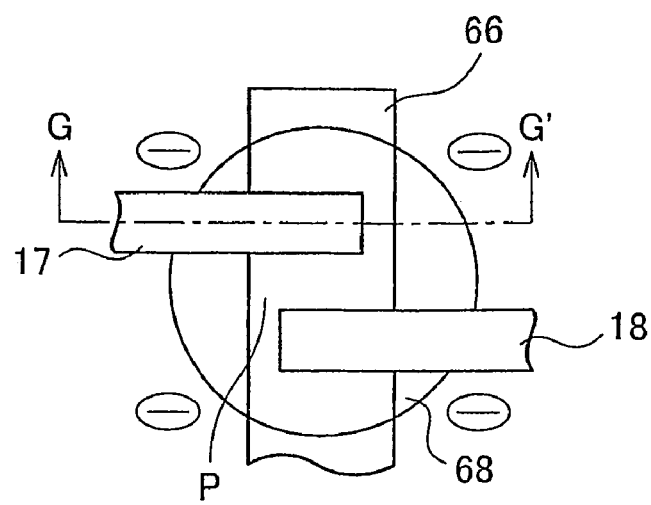
FIG. 16(a) is a plan view illustrating an arrangement in which a leak current hardly occurs between a source electrode and a drain electrode, in case a shape of the semiconductor layer is protruded out of a gate electrode area of the TFT section.
FIG. 16(b) is a cross sectional view taken on line G-G' of FIG. 16(a).
Figure 16:
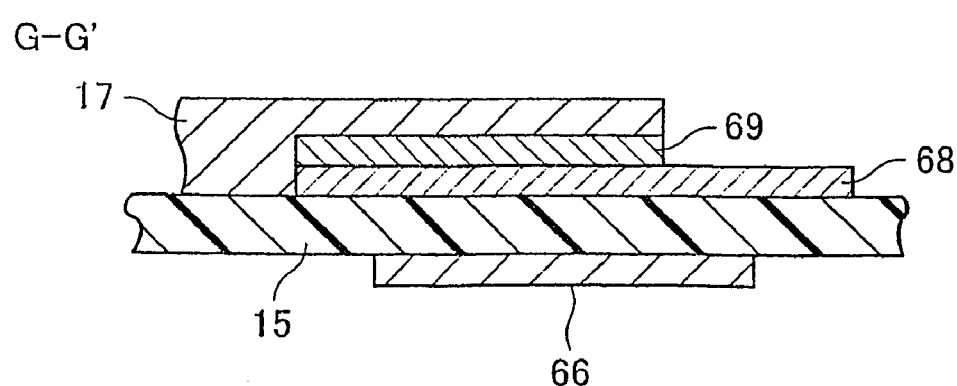
Figure 17:
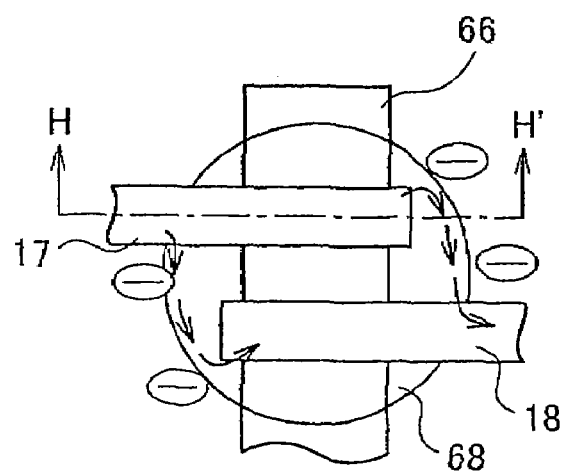
FIG. 17(a) is a plan view illustrating an arrangement in which a leak current easily occurs between a source electrode and a drain electrode, in case a shape of the semiconductor layer is protruded out of the gate electrode area of the TFT section.
FIG. 17(b) is a cross sectional view taken on line H-H' of FIG. 17(a).
Figure 17:
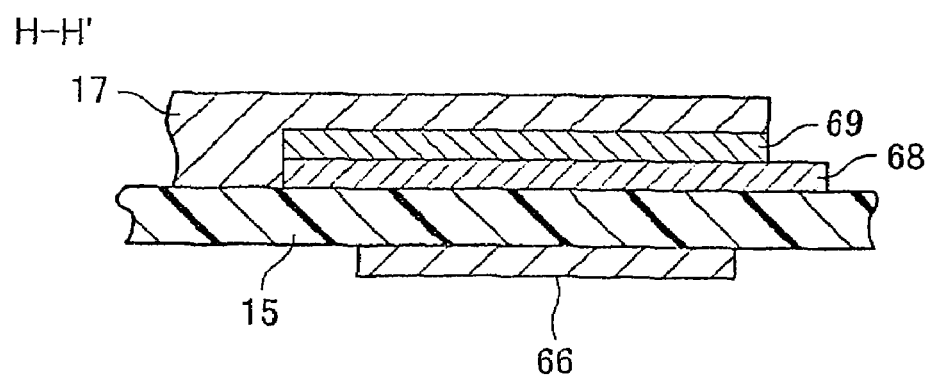

FIG. 16(a) is a plan view of the TFT section in case where the source electrode 17 is inside of the line of the edge of the TFT-section gate electrode 66, and on the TFT-section gate electrode 66. FIG. 16(b) is a cross sectional view taken on line G-G' line of FIG. 16(a). On the other hand, FIG. 17(a) is a plan view of the TFT section in case where the source electrode 17 is extended beyond the line of the edge of the TFT-section gate electrode 66, that is, extended out of the TFT-section gate electrode 66. FIG. 17(b) is a cross sectional view taken on line H-H' line of FIG. 17(a).

Note that, FIGS. 16(a) and 17(a) illustrate cases where a negative potential is applied on the TFT-section gate electrode 66. As shown in FIGS. 16(b) and 17(b), the TFT-section gate electrode 66 faces the a-Si layer 68, sandwiching the gate insulating layer 15 therebetween. Here, the n+ layer 69 is a layer that introduces a carrier into the a-Si layer 68, and a layer that is doped with phosphorus (P) or the like and has excess electrons.

In the TFT in FIGS. 16(a), 16(b), 17(a), and 17(b), a leak current between the source and drain electrodes 17 and 18 was measured when for example a voltage of −4V was applied on the TFT-section gate electrode 66. As a result, the leak current was about 1 pA in the case where the source and drain electrodes 17 and 18 were on the TFT-section electrode 66. On the other hand, in the case where the source and drain electrodes 17 and 18 were extended out of the TFT-section gate electrode 66, the leak current was increased to 20 pA to 30 pA.

This proved that the TFT characteristics are deteriorated if the source and drain electrodes 17 and 18 are extended outward. Moreover, a cause of this result can be explained as below. Firstly, explained is the case where a negative potential is applied on the TFT-section gate electrode 66. In case the TFT-section gate electrode 66 has a negative potential, electrons, which are carriers, are drifted from the TFT-section gate electrode 66 due to repulsion between negative charges. Therefore, the electrons exists around a semiconductor region, and very few electrons are present in the a-Si layer 68 on the TFT-section gate electrode 66. Because of this, TFT is in an OFF state.

Even if the electrons try to flow between the gate and drain electrodes 17 and 18, the electrons should pass through part (P) of the TFT-section gate electrode 66, in which a negative potential is applied. The repulsion between negative charges does not allow the electrons to pass through the TFT-section gate electrode 66. It is considered that the leak current is small because of this.

On the other hand, in case of FIG. 17(a), even if the TFT-section gate electrode 66 has a negative potential, the electrons do not need pass through the part (P) of the TFT-section gate electrode 66, in which a negative potential is applied, but can move along an outer circumference of the a-Si layer 68, because the source and drain electrodes 17 and 18 are extended beyond an outer edge of the TFT-section gate electrode 66. It is considered that the leak current is easily flowed because of this.

As understood from the above explanation, it is preferable that the source and drain electrodes 17 and 18 are inside of the outer edge of the TFT-section gate electrode 66 (that is, on the TFT-section gate electrode 66). Next, explained is a case where a positive potential is applied on the TFT-gate electrode 66. In case where the TFT-section gate electrode 66 has a positive potential, the electrons of the n+ layer 69 is pulled by the potential of the TFT-section gate electrode 66, and the carriers exist in the channel section. Therefore, the current is easily flowed between the source and drain electrodes 17 and 18, so that the TFT is in an ON state. For example, when a voltage of 10V was applied across the TFT-section gate electrode 66, a current of about 1 μA flowed between the source and drain electrodes 17 and 18. Here, an applied voltage between the source and drain electrodes was 10V. When the TFT is ON, the electrons try to flow in a shortest distance between the source and drain electrodes 17 and 18. Therefore, the extending of the source and drain electrodes 17 and 18 beyond the outer edge of the TFT section electrode 66 does not affect.

Moreover, even though the formation of the resist layer 94 is carried out by applying (dropping/jetting) one droplet from the ink jet head 33 here, the formation may be carried out by dropping a plurality of droplets. However, it should be noted that it takes a long time to form one semiconductor layer 93 and the life of the ink jet head 33 is shortened by an increase in a number of dots (a number of jetting), if the formation of the resist layer 94 is carried out by jetting, with extreme precision, minim droplets that have been reduced in size without restriction.

It is important in each step using the ink jet head 33 that the formation of the layer (film) having a desired area be carried out by applying the droplets in a most suitable amount of droplet and a number of shooting (the number of jetting) as less as possible. By performing the application of the droplets as such, it is possible to maximum a number of time to use the ink jet head 33 within the life thereof, thereby keeping the cost of equipment lowest.

Further, the semiconductor formation step 44 has such an important feature that no special treatment is required for the surface on which the droplet jetted out of the ink jet head 33 is dropped. If the surface on which the droplet is dropped on is extremely wettable, the surface requires patterning. Otherwise, the droplet jetted onto the surface would be spread so as to form an indeterminated shape, thereby failing the formation of the layer. However, on (a surface of) the a-Si formation layer 64, there are a large number of ends made of Si. Because of this, the surface of the a-Si formation layer 64 is basically dewettable. Thus, the droplet on the a-Si formation layer 64 has a contact angle that is large to some extent, and has a quasi-circular shape. Therefore, it is unnecessary to process the substrate (the a-Si formation layer 64) specially.

Moreover, with a large possibility, substances having short molecular-length tend to adhere on the surface of the substrate that has been subjected to the baking, process in gas (dry-etching), and the like process. Thus, even if a semiconductor other than a-Si, for example an organic semiconductor, is used, the droplet thus jetted out exists, in many cases, with a contact angle that is large to some extent.

Conventionally, the patterning of the semiconductor layer needs a mask and a photolithography step. On the other hand, in the semiconductor layer formation step 44, the droplet is applied from the ink jet head 33 so as to directly draw the pattern (resist layer 94) that is to be mask. Thus, the mask and the photolithography step that needs the mask are no longer necessary. This significantly lowers the cost.

Note that, in order to form the semiconductor layer 93 resembling to the shape of the applied droplet, it is possible to adopt a method in which the raw material of the semiconductor layer 93 is directly applied (dropped) by using the pattern formation apparatus, besides the above-described method in which the resist layer 94 is formed by dropping droplets, and the semiconductor layer 93 is formed by using the thus formed resist layer 94 as a mask. As the semiconductor raw material in this case, an organic semiconductor raw material such as polyvinylcarbazole (PVK) and polyphenylene vinylene (PPV) may be used.

As described above, the branch electrode sections 91a and 92a are so formed that parts of the branch electrode sections 91a and 92a are extended in oblique directions with respect to the directions along which the TFT-section gate electrode 66 is protruded, the parts associating with the branching-off parts 91b and 92b, respectively. (In other words, the part are respectively between (i) the branching-off parts 91b and 92b and parallel parts of the branch electrode sections 91a and 92a.) The branch electrode sections 91a and 92a are so formed mainly because of the following reason.

The semiconductor layer 93 thus formed in the similar shape to the shape of the applied droplet may become larger than the semiconductor layer 16. In this case, in order to avoid the adherence of a splash droplet on the channel section 72, the branching-off parts 91b and 92b, which are in the drop-on positions 81, should be located in a further distance from where the TFT-section gate electrode 66 is located, comparing with the arrangement shown in FIG. 1. On the other hand, it is necessary that the electrode raw material applied in positions corresponding to the branching-off parts 91b and 92b (drop-on positions 81) be spread up to the ends of the branch electrodes of the branch electrode sections 91a and 92a. By forming the branch electrode sections 91a and 92a such that the parts associating with the branching-off parts 91b and 92b are oblique, it is possible to locate the branching-off parts 91b and 92b in a farther distance from the TFT-section gate electrode 66, while avoiding the branch electrode sections 91a and 92b from being long between the branching-off part 91b or 92b and the ends.

Moreover, even in case where the droplet from the pattern formation apparatus is applied onto a position (drop-on position 84) shifted from the targeted drop-on position 81 toward the channel section 72, for example, a gap between the branch electrodes of the branch electrode section 91a in the position at which the droplet is applied is narrower than a gap between the branch electrodes of the branch electrode section 17a shown in FIG. 1, because the parts of the branch electrode sections 91a and 92b are oblique, the parts associating with the branching-off parts 91b and 92b. As a result, compared with the arrangement shown in FIG. 1, it is easy to drop the droplet onto the branch electrode sections 91a and 92a. This permits a wider allowance with respect to the drop-on positions 81 at which the electrode raw material is targeted.

Third Embodiment

Still another embodiment of the present invention is described below, referring to FIGS. 10(a) and 10(b).

Figure 10:
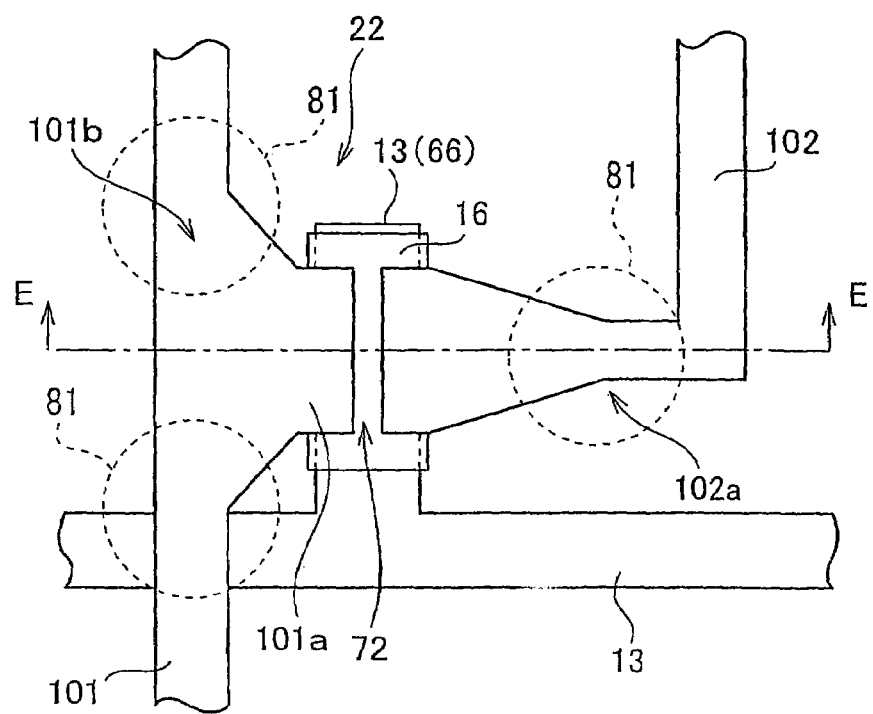
FIG. 10(a) is a plan view illustrating the TFT section of the TFT array substrate of still another embodiment of the present invention.
FIG. 10(b) is a cross sectional view illustrating part corresponding a cross section taken on line E-E of FIG. 10(a), FIG. 10(b) showing the part before a source electrode and a drain electrode are formed.
Figure 10:
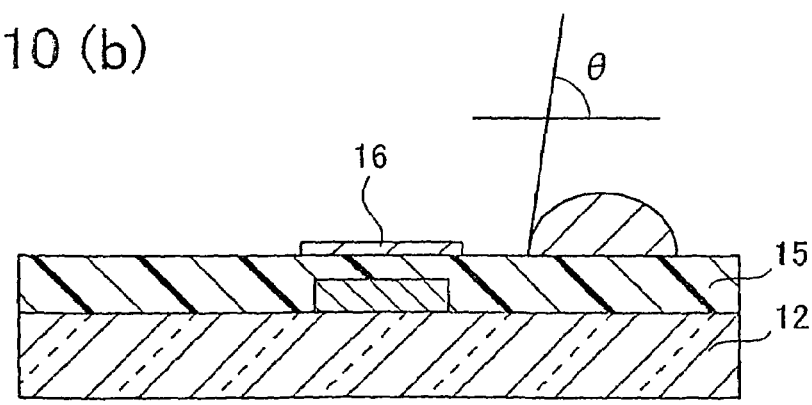

In the present embodiment, a TFT section 22 of a TFT array substrate 11 has an arrangement shown in FIG. 10(a). The TFT section 22 is provided with a source electrode 101 and a drain electrode 102, instead of the source electrode 17 and the drain electrode 18, and, for example, a semiconductor layer 16 described above. The TFT array substrate 11 may be manufactured in the same method as in the first embodiment.

The source electrode 101 has the following shape: in a branch electrode section 101a extended over a semiconductor layer 16, part associating with a branching-off part 101b has a large area (is wider). (The branch electrode section 101a gets wider as the branch electrode section 101a gets closer to the branching-off part 101b.) In other words, the branch electrode section 101a is protruded in a trapezium shape from the source electrode 101, and a bottom of the trapezium shape is the branching-off part 101b.

In order to have such arrangement, the source electrode 101 gets gradually wider at part from where the branch electrode section 101a is branched off, so as to be wider toward both sides of the branch electrode section 101a connected to the source electrode 101. In other words, the width of the branch electrode section 101a gets gradually narrower from two bottom angles of the trapezium shape (both the sides of the branch electrode section 101a) to an upper side part thereof, which is protruded on the semiconductor layer 16. Further in other words, where the two bottom angle sections are referred to as a source transition part via which the main line (source wire) of the source electrode 101 is continuous with the part of the source electrode 101 associating the TFT section 22, a width of each source transition part gets wider gradually from the source wire toward the forming area of the semiconductor layer 16 (the area in which the semiconductor layer 16 exists).

Therefore, in the source electrode 101 having such arrangement, drop-on positions 81 described above are located in parts (the two source transition parts) of the source electrode 101, the parts respectively located both sides of the branching-off parts 101b from which the branch electrode section 101a is branched off, whereby a droplet of an electrode raw material is applied out of the area in which the channel section 72 (semiconductor layer 16) exists.

On the other hand, the drain electrode 102 gets gradually wider from a vicinity of the cannel section 72 toward the channel section 72. In other words, supposing that the vicinity is referred to as a drain transition part, via which the wire (drain wire) of the drain electrode 102 is continuous with the part of the drain electrode 102 being closer to the TFT section 22, a width of the drain transition part gets wider gradually from the drain wire toward the forming area of the semiconductor layer 16. Then, an electrode width widening starting section 102a (that is the drain transition part) is the drop-on position 81.

In this arrangement, the electrode raw material is dropped on to an electrode formation area prepared by (i) forming a guide having a mountain-like shape or (ii) wetting/dewetting process, in a source/drain wire preprocessing step 45 described above. Then, in the electrode formation area, a contact angle θ shown in FIG. 10(b) causes the electrode raw material to be drawn toward a direction in which the electrode formation area gets wider, and to flow in the direction (spontaneously). Therefore, even in case the drop-on position 81 is set out of the area (forming area) where the channel section 72 (semiconductor layer 16) is located, it is easy to render the thus applied electrode raw material to reach ends of the channel section 72. Thus, the application (dropping) of the wire raw material makes it possible to surely form the source electrode 101 and the drain electrode 102 in the TFT section 22.

In case where the wire such as the electrodes or the like is formed by applying the droplet by using the pattern formation apparatus as described above, it is possible to control flow direction of the applied droplet by controlling the width of the wire (width of the wire formation area).

Note that in the present third embodiment, described is the arrangement in which the TFT is composed of one channel section 72. However, it is needless to say that the width of the wire can be modified in the electrode section in the TFT described in the first and second embodiment, and a fourth embodiment described later.

Fourth Embodiment

Yet another embodiment of the present invention will be described below, with reference to FIG. 11.

Figure 11:
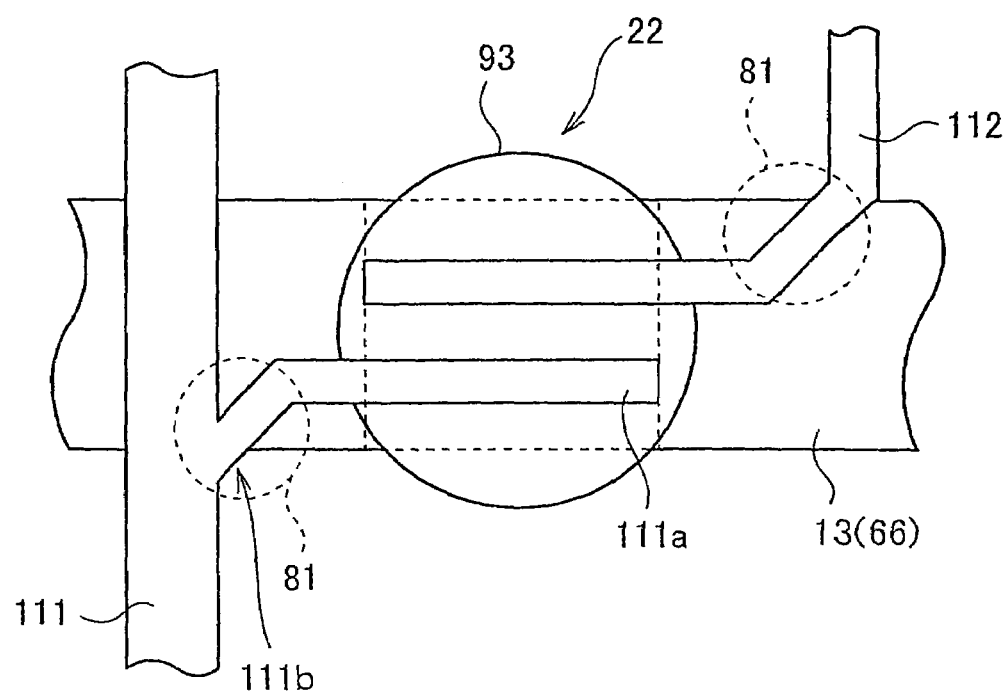
FIG. 11 is a plan view illustrating an arrangement of the TFT section of the TFT array substrate of yet another embodiment of the present invention.

In the present embodiment, a TFT section 22 of a TFT array substrate 11 has an arrangement shown in FIG. 11. The TFT section 22 is provided with a source electrode 111 and a drain electrode 112, instead of the source electrode 17 and the drain electrode 18, and for example, a semiconductor layer 93 described above. The semiconductor layer 93 has a substantially circular shape and formed above a linear gate wire (a stem wire of a gate electrode 13) sandwiching a gate insulation layer 15 (see FIGS. 9(a) to (e)) therebetween. The TFT array substrate 11 may be manufactured by the same method as in the second embodiment.

In each arrangement shown in FIGS. 1 to 8, the plurality of electrodes are formed in the TFT section 22, and the branch electrode sections 17a and 18a, or the branch electrode sections 91a and 92a are formed so as to form the wide channel section 72. Such arrangements are effective in case where a charge transfer is large, for example, in case where a large number of pixels are to be driven. Moreover, the arrangements have such an advantage that stable property can be obtained with ease (i) even if the pattern of the TFT-section gate electrode 66 is shifted from the pattern of the source electrode 17 or 91 (branch electrode section 17a or 91a) and the drain electrode 18 or 92 (branch electrode section 18b or 92b) in the direction in which the TFT-section gate electrode 66 is extended, and (ii) especially in the arrangement shown in FIG. 1, even if the pattern of the TFT-section gate electrode 66 is shifted from the pattern of the source electrode 17 or 91 (branch electrode section 17a or 91a) and the drain electrode 18 or 92 (branch electrode section 18b or 92b) further in the direction perpendicular to the direction in which the TFT-section gate electrode s 66 is extended.

In the arrangement of the present embodiment shown in FIG. 11, the branch electrode section 111a, which is branched off from the source electrode 111 and extended above (on) the semiconductor layer 93, and parts of the drain electrode 112 that are closer to the channel section 72 are provided in the direction in which the TFT-section gate electrode is extended, and within an area in which the TFT section electrode 66 is located.

In other words, branch electrodes of the branch electrode section 111a are extended from the source wire crossing the gate wire, and along the gate wire, so as to be extended on the semiconductor layer 93. Whereas, the drain electrode 112 are extended from the drain wire extended perpendicular to the direction in which the gate wire is extended, so as to be extended on the semiconductor layer 93 along the gate wire. Note that a section at which the branch electrode section 111a is branched off from the source wire is referred to a source transit section, whereas a section at which the drain electrode 112 is branched off from the drain wire is referred to as a drain transit section.

In this arrangement, the TFT section 22 is relatively small. This is advantageous for realization of a high aperture ratio.

In the above arrangement, drop-on positions 81 out of (off) the channel section 72 (semiconductor layer 93) are located in positions (that is, the source transit section) corresponding to branching-off parts 111b of the branch electrode section 111a with respect to the source electrode 111. Moreover, with respect to the drain electrode 112, the drop-on positions 81 are located in positions (that is, the drain transit section) at which the drain electrode 112 is bent toward the channel section 72. With this arrangement, it is possible to prevent that the channel section 72 is adhered with a splash droplet of the electrode raw material applied from the pattern formation apparatus.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

Note that the thin film transistor may be so arranged that location of the branching-off parts as drop-on positions on which the droplet is to be applied is so set that the droplet is applied on the channel section, based on allowance in applying the droplet on the drop-on positions for forming the branch electrode section by applying the droplet.

This arrangement further ensures the prevention of the adherence of the splash droplet on the channel section between each electrode in forming the source electrode and the drain electrode by applying the droplet of the electrode raw material.

The thin film transistor may be so arranged that each branch electrode has a parallel part being parallel to each other on the semiconductor layer, each branch electrode being linear between the parallel part and the branching-off part.

With the above arrangement, it is possible to surely position the branching-off parts farer from the channel section in order to avoid the adherence of the splash droplet on the channel section between each electrode, and at the same time, to avoid a long length of the branch electrodes from the branching-off section to the ends thereof.

The thin film transistor may be so arranged that at least one of the source electrode and the drain electrode has a part that gets gradually wider toward the forming area of the semiconductor layer.

This arrangement makes it easier for the applied droplet to flow in the direction in which the electrode gets wider. Thus, this allows the drop-on positions to be located farer from the channel section, and ensures the flow of the electrode raw material from the drop-on positions toward the forming area of the semiconductor layer.

The manufacturing method of the thin film transistor may be so arranged that in the step of preprocessing, the electrode formation area is so formed that at least one of the source electrode and the drain electrode has a branch section at branching-off parts thereof located off a formatting area of the semiconductor layer, the branch section including a plurality of branch electrodes on the semiconductor layer, the branch electrodes of a first electrode sandwiching a second electrode where the first electrode is the at least one of the source electrode and the drain electrode, and the second electrode is the other; and in the step of applying the droplet, positions respectively corresponding to the branching-off parts are the drop-on positions on which the droplet of the electrode raw material is applied.

With this arrangement, because the droplet of the electrode raw material is applied on the branching-off parts of the branch electrode section, it is possible to appropriately form the branch electrode section of the source electrode and/or the drain electrode by applying the droplets in a small number of time.

The manufacturing method of the thin film transistor may be so arranged that the drop-on positions are so set that the droplet is not applied on the channel section, based on allowance included in on the drop-on positions.

This arrangement further ensures the prevention of the adherence of the splash droplet on the channel section between the electrodes in forming the source electrode and the drain electrode by applying the droplet of the electrode raw material.

The manufacturing method of the thin film transistor may be so arranged that each branch electrode is so formed as to have a parallel part being parallel to each other on the semiconductor layer, each branch electrode being linear between the parallel part and the branching-off part.

With the above arrangement, it is possible to surely position the branching-off parts farer from the channel section in order to avoid the adherence of the splash droplet on the channel section between each electrode, and at the same time, to avoid a long length of the branch electrodes from the branching-off parts to the ends thereof.

The manufacturing method of the thin film transistor may be so arranged that in the step of preprocessing, the electrode formation area is so formed that the source electrode and/or the drain electrode has a part that gets gradually wider toward the forming area of the semiconductor layer; and in the step of applying the droplet, the droplet of the electrode raw material is applied onto the drop-on positions located in the positions from which the part gets gradually wider.

With the above arrangement, the droplet applied on the electrode formation area is pulled in the direction in which the electrode formation area is wider, and flows along the direction. Thus, even in a case where the drop-on positions are located off the forming area of the semiconductor layer, it becomes easier for the electrode raw material thus applied to reach up to the ends of the source electrode and the drain electrode, the ends being closer to the channel section. This arrangement ensures the formation of the source electrode and the drain electrode by application (dropping/jetting) of the droplet of the electrode raw material.

The manufacturing method of the thin film transistor may be so arranged that in the step of preprocessing, the electrode formation area is so formed that, in an area in which the gate electrode exists, parts of the source electrode and the drain electrode respectively extended toward the forming area of the semiconductor layer is parallel to a direction in which the gate electrode is extended.

With the above arrangement, it is possible to miniaturize the thin film transistor. Thus, for example in a liquid crystal display apparatus provided with the thin film transistor, it is possible to realize a high aperture ratio.

Although the invention has been specifically described by using the embodiments and examples in the Best Mode for Carrying Out, it should be understood by those of ordinary skill in the art that the embodiments and examples are to simply explain those of the technical feature of the present invention, but are not to limit the present invention thereto. The present invention shall not be interpreted only with in the embodiments and the examples, and can be modified in other ways within the spirit of the invention and the scope of the claims recited below.

INDUSTRIAL APPLICABILITY

The present invention is able to provide a thin film transistor having an electrode arrangement in which a splash droplet of an electrode raw material will not be adhered on a channel section of the thin film transistor, and a manufacturing method of the same.

The invention claimed is:

1. A thin film transistor comprising (i) a semiconductor layer, which faces a gate electrode via a gate insulation layer, (ii) a source electrode and a drain electrode, which are electrically connected with the semiconductor layer, and (iii) a channel section between the source electrode and the drain electrode, wherein:

the source electrode and the drain electrode are formed by applying a droplet of an electrode raw material, and have a branch section at branching-off parts thereof located off a forming area of the semiconductor layer, the branch section including a plurality of branch electrodes, at least part of which are in a forming area of the semiconductor layer, the branch electrodes of the source electrode and the branch electrodes of the drain electrode being alternately arrayed, and the branching-off parts are located at drop-on positions on which the droplet of the electrode raw material forming the source electrode and the drain electrode is to be dropped, and are positioned removed from the channel section, the position of the branching-off parts removed from the channel position is based on allowance of the drop-on positions.

2. The thin film transistor as set forth in claim 1, wherein:
each branch electrode has a parallel part being parallel to each other within the forming area of the semiconductor layer, each branch electrode being linear between the parallel part and the branching-off part.

3. The thin film transistor as set forth in claim 1, wherein:
at least one of the source electrode and the drain electrode has a part that gets gradually wider toward the forming area of the semiconductor layer.

4. The thin film transistor as set forth in claim 3, wherein:
the source electrode and the drain electrode have ends respectively that are closer to the semiconductor layer; and
the part that gets gradually wider is located between one of the branching-off parts and one of the ends.

5. The thin film transistor as set forth in claim 1, wherein:
the channel section has a width not longer than a length of the branch electrode sections.

6. The thin film transistor as set forth in claim 1, wherein:
the branch electrodes of the source electrode, or the branch electrodes of the drain electrode are so arrayed that a gap between each adjacent pair of the branch electrodes gets wider as the branch electrodes are extended toward the channel section from the branching-off parts.

7. The thin film transistor as set forth in claim 1, wherein:
the semiconductor layer has a substantially circular pattern whose diameter is larger than a width part of the gate electrode located on the channel section.

8. The thin film transistor as set forth in claim 1, wherein:
the semiconductor layer has a substantially circular pattern whose diameter is larger than a width part of the gate electrode located on the channel section; and
an end of each branch electrode is within the width part of the gate electrode, but does not go beyond the width part of the gate electrode.

9. A thin film transistor transistor comprising (i) a semiconductor layer, which faces a gate electrode via a gate insulation layer, (ii) a source electrode and a drain electrode, which are electrically connected with the semiconductor layer, and (iii) a channel section between the source electrode and the drain electrode, wherein:
the source electrode and the drain electrode have a branch section at branching-off parts thereof located off a forming area of the seniiconductor layer, the branch section including a plurality of branch electrodes, at least part of which are in a forming area of the semiconductor layer, the branch electrodes of the source electrode and the branch electrodes of the drain electrode being alternately arrayed, and
the branching-off parts are located at drop-on positions on which the droplet of the electrode raw material forming the source electrode and the drain electrode is to be dropped, and are positioned removed from the channel section, the position of the branching-off parts removed from the channel position is based on allowance of the drop-on positions.

10. A liquid crystal display apparatus comprising a thin film transistor, wherein:
the thin film transistor includes (i) a semiconductor layer, which faces a gate electrode via a gate insulation layer, (ii) a source electrode and a drain electrode, which are electrically connected with the semiconductor layer, and (iii) a channel section between the source electrode and the drain electrode,
the source electrode and the drain electrode being formed by applying a droplet of an electrode raw material, and having a branch section at branching-off parts thereof located off a forming area of the semiconductor layer, the branch section including a plurality of branch electrodes, at least part of which are in a forming area of the semiconductor layer, the branch electrodes of the source electrode and the branch electrodes of the drain electrode being alternately arrayed, and
the branching-off parts are located at drop-on positions on which the droplet of the electrode raw material forming the source electrode and the drain electrode is to be dropped, and are positioned removed from the channel section, the position of the branching-off parts removed from the channel position is based on allowance of the drop-on positions.

11. A thin film transistor comprising (i) a semiconductor layer, which faces a gate electrode via a gate insulation layer, (ii) a source electrode and a drain electrode, which are electrically connected with the semiconductor layer, and (iii) a channel section between the source electrode and the drain electrode, wherein:
the source electrode and the drain electrode are formed by applying a droplet of an electrode raw material, and have a branch section at branching-off parts thereof located off a forming area of the semiconductor layer, the branch section including a plurality of branch electrodes, at least part of which are in a fonning area of the semiconductor layer, the branch electrodes of the source electrode and the branch electrodes of the drain electrode being alternately arrayed, and
at least one of the source electrode and the drain electrode has a part that gets gradually wider toward the forming area of the semiconductor layer.

12. A thin film transistor comprising (i) a semiconductor layer, which faces a gate electrode via a gate insulation layer, (ii) a source electrode and a drain electrode, which are electrically connected with the semiconductor layer, and (iii) a channel section between the source electrode and the drain electrode, wherein:
the source electrode and the drain electrode are formed by applying a droplet of an electrode raw material, and have a branch section at branching-off parts thereof located off a forming area of the semiconductor layer, the branch section including a plurality of branch electrodes, at least part of which are in a forming area of the semiconductor layer, the branch electrodes of the source electrode and the branch electrodes of the drain electrode being alternately arrayed,
the branch electrodes of the source electrode, or the branch electrodes of the drain electrode are so arrayed that a gap between each adjacent pair of the branch electrodes gets wider as the branch electrodes are extended toward the channel section from the branching-off parts, and the semiconductor layer has a substantially circular pattern whose diameter is larger than a width part of the gate electrode located on the channel section.

13. A thin film transistor comprising (i) a semiconductor layer, which faces a gate electrode via a gate insulation layer, (ii) a source electrode and a drain electrode, which are electrically connected with the semiconductor layer, and (iii) a channel section between the source electrode and the drain electrode, wherein:

the source electrode and the drain electrode are formed by applying a droplet of an electrode raw material, and have a branch section at branching-off parts thereof located off a forming area of the semiconductor layer, the branch section including a plurality of branch electrodes, at least part of which are in a forming area of the semiconductor layer, the branch electrodes of the source electrode and the branch electrodes of the drain electrode being alternately arrayed, the semiconductor layer has a substantially circular pattern whose diameter is larger than a width part of the gate electrode located on the channel section, and an end of each branch electrode is within the width part of the gate electrode, but does not go beyond the width part of the gate electrode.

* * * * *